(12) United States Patent
Sakata et al.

(10) Patent No.: US 7,791,202 B2
(45) Date of Patent: Sep. 7, 2010

(54) SEMICONDUCTOR DEVICE HAVING OXIDIZED METAL FILM AND MANUFACTURE METHOD OF THE SAME

(75) Inventors: Atsuko Sakata, Kanagawa (JP); Junichi Wada, Kanagawa (JP); Seiichi Omoto, Kanagawa (JP); Masaaki Hatano, Kanagawa (JP); Soichi Yamashita, Kanagawa (JP); Kazuyuki Higashi, Kanagawa (JP); Naofumi Nakamura, Tokyo (JP); Masaki Yamada, Kanagawa (JP); Kazuya Kinoshita, Kanagawa (JP); Tomio Katata, Kanagawa (JP); Masahiko Hasunuma, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 87 days.

(21) Appl. No.: 12/010,371

(22) Filed: Jan. 24, 2008

(65) Prior Publication Data
US 2008/0122102 A1    May 29, 2008

Related U.S. Application Data

(62) Division of application No. 11/335,584, filed on Jan. 20, 2006, now Pat. No. 7,351,656.

(30) Foreign Application Priority Data
Jan. 21, 2005   (JP) .................... P2005-014453

(51) Int. Cl.
*H01L 23/48* (2006.01)
*H01L 23/52* (2006.01)
*H01L 29/40* (2006.01)

(52) U.S. Cl. .......... 257/763; 257/751; 257/E23.01; 257/E23.019

(58) Field of Classification Search .............. None
See application file for complete search history.

(56) References Cited

U.S. PATENT DOCUMENTS

| 5,215,588 | A | | 6/1993 | Rhieu |
| 5,567,987 | A | * | 10/1996 | Lee ............... 257/751 |
| 6,090,701 | A | | 7/2000 | Hasunuma et al. |

(Continued)

FOREIGN PATENT DOCUMENTS

JP    10-125782    5/1998

(Continued)

OTHER PUBLICATIONS

Japanese Notice of Grounds for Rejection Issued in Counterpart Japanese Patent Application No. 2006-009978 mailed Jul. 14, 2009 (13 pages).

(Continued)

*Primary Examiner*—Jarrett J Stark
(74) *Attorney, Agent, or Firm*—Finnegan, Henderson, Farabow, Garrett & Dunner, L.L.P.

(57) ABSTRACT

A method for manufacturing a semiconductor device includes heating a substrate having an insulation film thereon to a first substrate temperature so that oxidizing species are emitted from the insulating film, the insulating film having a recessed portion formed in a surface thereof, forming a metal film on the insulating film at a second substrate temperature lower than the first substrate temperature, and oxidizing at least part of the metal film with oxidizing species remaining in the insulating film.

20 Claims, 29 Drawing Sheets

U.S. PATENT DOCUMENTS

| | | | |
|---|---|---|---|
| 6,136,702 A * | 10/2000 | Chandross et al. | 438/678 |
| 6,162,741 A | 12/2000 | Akasaka et al. | |
| 6,348,402 B1 | 2/2002 | Kawanoue et al. | |
| 6,432,820 B1 | 8/2002 | Lee et al. | |
| 6,485,564 B1 | 11/2002 | Liu et al. | |
| 7,014,709 B1 | 3/2006 | Fair | |
| 2002/0081839 A1 | 6/2002 | Shimooka et al. | |
| 2003/0116854 A1 | 6/2003 | Ito et al. | |
| 2004/0266217 A1 | 12/2004 | Kim et al. | |
| 2006/0091559 A1 | 5/2006 | Nguyen et al. | |

FOREIGN PATENT DOCUMENTS

| | | |
|---|---|---|
| JP | 10-256372 | 9/1998 |
| JP | 2000-124307 | 4/2000 |
| JP | 2001-196453 | 7/2001 |
| JP | 2001-220287 | 8/2001 |
| JP | 2002-170821 | 6/2002 |
| JP | 2003-297814 | 10/2003 |
| JP | 2004-14763 | 1/2004 |

OTHER PUBLICATIONS

Copending U.S. Appl. No. 11/896,271, filed Aug. 30, 2007, inventors: Atsuko Sakata et al., published as U.S. App. Pub. No. 2008/0090410 A1, Apr. 17, 2008.

Copending U.S. Appl. No. 12/010,372, filed Jan. 24, 2008, inventors: Atsuko Sakata et al., published as U.S. Pat. App. Pub. No. 2008/0261398 A1, Oct. 23, 2008.

Decision of Refusal issued by the Japanese Patent Office on Jun. 8, 2010, for Japanese Patent Application No. 2009-212140, and English-Language translation thereof.

* cited by examiner

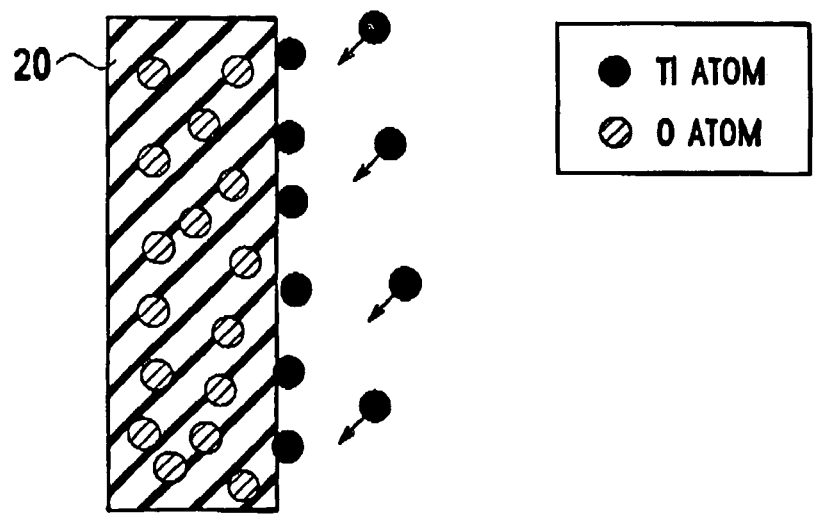
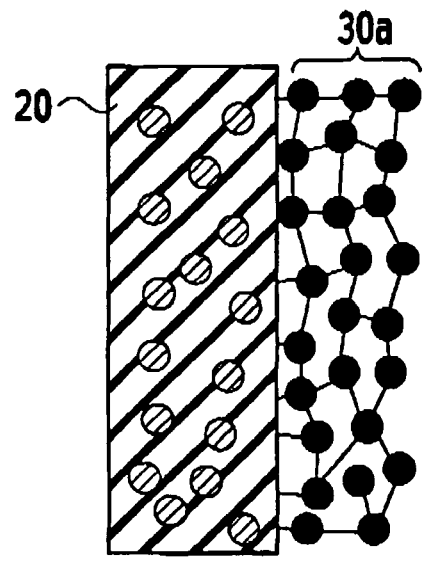
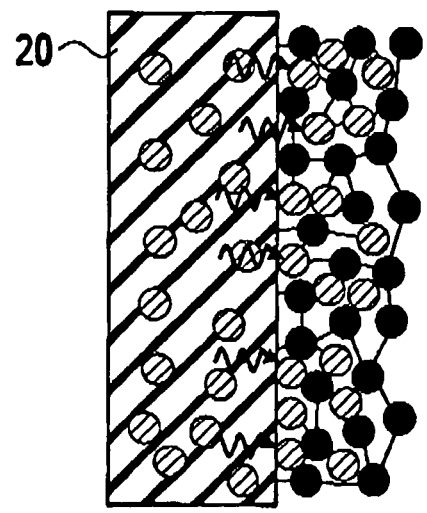
FIG. 15A
FIG. 15B
FIG. 15C (STAGE TEMPERATURE: 25°C)

(STAGE TEMPERATURE: 20°C)

| HEAT TREATMENT TEMPERATURE | CONCENTRATION OF Ti IN Cu FILM (ATOM/cm³) |
|---|---|
| 150°C | BACKGROUND ($2 \times 10^{16}$) |
| 200°C | $\sim 2 \times 10^{17}$ |
| 250°C | $\sim 4 \times 10^{17}$ |
| 300°C | $\sim 3 \times 10^{18}$ |

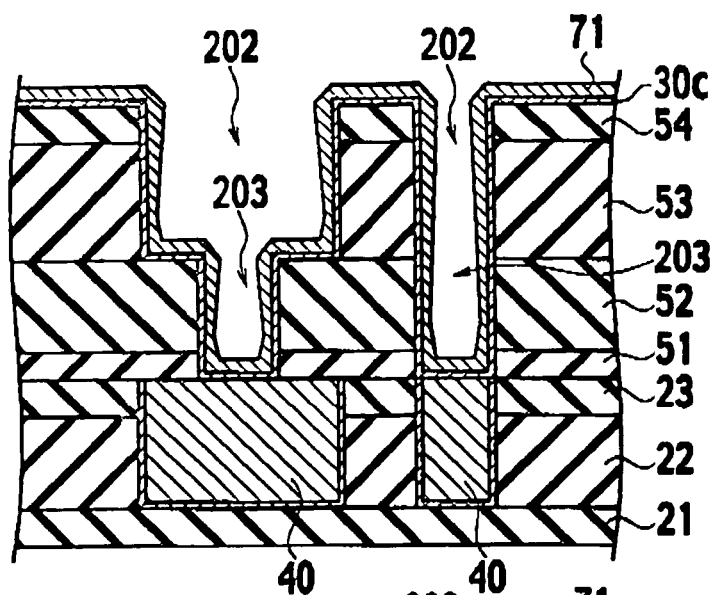
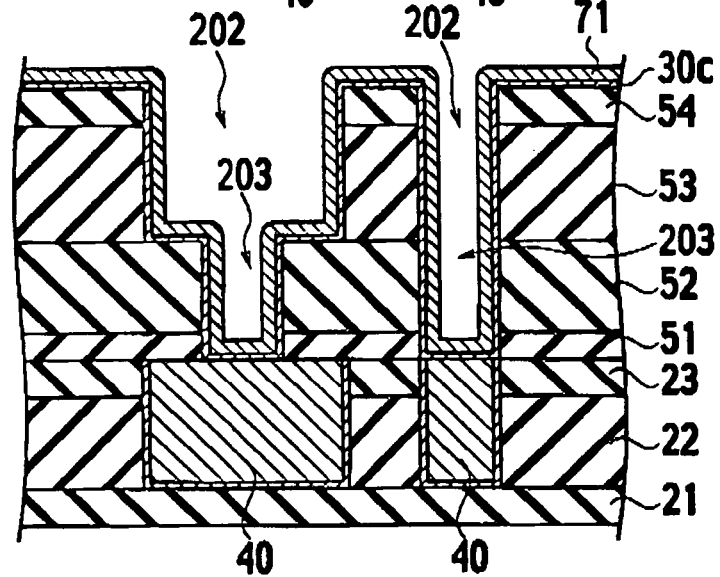
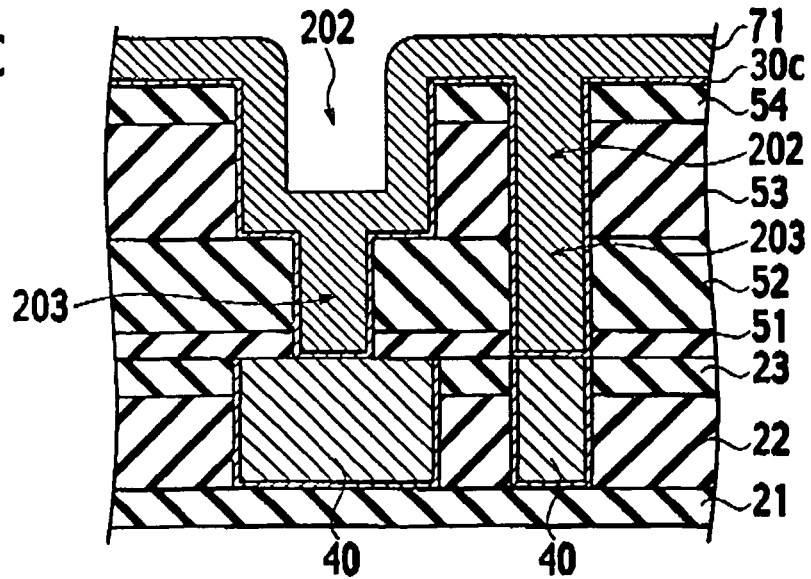

SEMICONDUCTOR DEVICE HAVING OXIDIZED METAL FILM AND MANUFACTURE METHOD OF THE SAME

CROSS REFERENCE TO RELATED APPLICATIONS AND INCORPORATION BY REFERENCE

This application is a divisional of application Ser. No. 11/335,584, filed Jan. 20, 2006 now U.S. Pat. No. 7,351,656, which is incorporated in its entirety herein by reference. This application is also based upon and claims priority from Japanese Patent Application 2005-014453 filed on Jan. 21, 2005, the entire contents of which are incorporated by reference herein.

BACKGROUND OF THE INVENTION

1. Field of the Invention

The present invention relates to the structure of a semiconductor device and a method for manufacturing the same. In particular, the present invention relates to an interconnection structure including barrier metal made of a copper film and a method for manufacturing the same.

2. Description of the Related Art

In multi-level wiring of semiconductor integrated circuits (LSIs), copper (Cu) films having a low resistivity are used. Damascene wiring that trenches and via holes formed in an inter-level insulating film is filled with a Cu film is in the mainstream. Interconnection widths are being decreased with reductions in the sizes of LSIs, and interconnection thickness are being decreased in order to reduce capacitances between interconnections. Accordingly, in a fine damascene interconnection, the proportion of a barrier metal film having a high resistivity in the cross-sectional area of the interconnection greatly influences the resistance of the interconnection. In other words, the resistance of the damascene interconnection decreases as the thickness of the barrier metal film decreases. However, the prevention of diffusion of Cu atoms into an inter-level insulating film, adhesion to a Cu film, and adhesion to the inter-level insulating film are simultaneously required for the barrier metal film.

In particular, adhesion between the barrier metal film and the Cu film is very important for the electromigration (EM) resistance and stress migration (SM) resistance of the interconnection. Further, it is desired that the barrier metal film be formed to have the smallest film thickness satisfying the above-described requirements, to have a uniform thickness on the bottom surfaces and side surfaces of trenches formed in the inter-level insulating film, and to be conformal.

Recent circumstances of the formation of a thin barrier metal film will be described. Ordinary physical vapor deposition (PVD) has poor step coverage. Accordingly, in a dual damascene structure formed by filling trenches and via holes formed in an inter-level insulating film with metal, it is difficult to form a conformal barrier metal film by PVD. Thus, ionized PVD has been developed in which metal ions are introduced by a substrate bias to improve bottom coverage and in which side coverage is improved using the resputtering effect of ions. The ionized PVD has been used to form a barrier metal film. However, conformal film formation adequate for ensuring interconnection resistance, barrier performance, and adhesion will become increasingly difficult due to reductions in interconnection widths and increases in the aspect ratios of interconnections in the future. Although a conformal barrier metal film can be formed by chemical vapor deposition (CVD), a high-temperature process cannot be applied to a wiring process because of the problem of SM failures. Accordingly, CVD has the problem that there are few kinds of source gases of material for forming a barrier metal film which are decomposed at temperatures allowable in the wiring process.

As a method for forming an extremely thin conformal film, atomic layer deposition (ALD) has been proposed in which a thin film is grown by stacking atomic layers on a surface of a substrate one by one. ALD is not suitable for the formation of a thick film but can form an extremely thin film with good step coverage. Similar to CVD, ALD has the problem that it is difficult to thermally decompose source gas at temperatures within the range allowable for a wiring process. Thus, there have been proposed a method in which decomposition is promoted by plasma irradiation in order to lower the temperature of a wiring process in the process of decomposing adsorbed source gas, and a method in which decomposition is promoted by UV light irradiation.

For recent inter-level insulating films, low-dielectric constant insulating films are used in order to reduce signal delays. Such low-dielectric constant insulating films include not only organic insulating films but also inorganic insulating films which contain a large amount of carbon (C) and have many vacancies and in which oxidizing species such as water ($H_2O$) are trapped. Accordingly, in a method in which the temperature of film formation is lowered using plasma irradiation in CVD or ALD, carbon in an insulating film is emitted by plasma irradiation in the process of decomposing source gas, whereby the insulating film is damaged. In particular, in the case of plasma using gas containing hydrogen (H) or oxygen (O), a low-dielectric constant insulating film is etched, and the insulating film may be delaminated.

In a low-dielectric constant insulating film containing a large amount of oxidizing species, there are cases where a barrier metal film is oxidized during the formation of the barrier metal film even if ALD or CVD is used in which decomposition temperature is lowered in an auxiliary manner using plasma irradiation or UV light irradiation. An oxidized barrier metal film cannot prevent oxidizing species from passing therethrough. As a result, the entire barrier metal film is oxidized by oxidizing species, whereby adhesion between the barrier metal film and wiring material such as a Cu film is lowered.

Adhesion between the barrier metal film and the Cu film includes adhesion depending on material and adhesion which changes with time due to a change in the quality of the barrier metal film. In particular, a change in adhesion with time causes an SM or EM failure or the like not only during a manufacturing process but also in actual use. Carbon-containing molecules in an insulating film are emitted in a process or an insulating film curing process involving plasma irradiation, electron beam (EB) irradiation, or ultraviolet (UV) light irradiation. As a result, the insulating film is damaged, and water is easily adsorbed on sites to which leaving carbon has bonded.

Causes of a change in the quality of the barrier metal film with time during a manufacturing process or in the actual use of an LSI include a decrease in adhesion between the barrier metal film and the Cu film which is caused by the oxidation of the barrier metal film with oxidizing species contained in the insulating film. Further, the carbonization (change to carbide) of the barrier metal film with C-containing molecules contained in the insulating film is also a cause of a change in the quality of the barrier metal film with time.

In the future, it will become increasingly difficult to prevent a change in the quality of the barrier metal film and to ensure adhesion between the barrier metal film and the Cu film. There has been proposed a process in which oxide is formed beforehand at the interface between the insulating film and the barrier metal film. However, in the case where oxide is actively formed, oxide having a large valence and a low concentration is formed. Thus, a desired form cannot be obtained.

SUMMARY OF THE INVENTION

An aspect of the present invention inheres in a method for manufacturing a semiconductor device. The method includes heating a substrate having an insulation film thereon to a first substrate temperature so that oxidizing species are emitted from the insulating film, the insulating film having a recessed portion formed in a surface thereof; forming a metal film on the insulating film at a second substrate temperature lower than the first substrate temperature; and oxidizing at least part of the metal film with oxidizing species remaining in the insulating film.

Another aspect of the present invention inheres in a method for manufacturing a semiconductor device. The method includes heating a substrate having an insulation film thereon to a first substrate temperature, the insulating film having a recessed portion formed in a surface thereof; forming a first metal film at a second substrate temperature lower than the first substrate temperature; oxidizing at least part of the first metal film in an oxidizing ambient at reduced pressure; and forming a second metal film on the first metal film at a third substrate temperature lower than the first substrate temperature.

Still another aspect of the present invention inheres in a method for manufacturing a semiconductor device. The method includes heating an insulation film thereon to a first substrate temperature, the insulating film having a recessed portion formed in a surface thereof; supplying a source gas to be adsorbed to a surface of the recessed portion at a second substrate temperature lower than the first substrate temperature; exhausting residual source gas which has not adsorbed to the surface of the recessed portion and irradiating light to the surface of the recessed portion to decompose molecules of the source gas adsorbed to the surface of the recessed portion and form a metal film made of atoms contained in the molecules of the source gas on the surface of the recessed portion.

Still another aspect of the present invention inheres in a method for manufacturing a semiconductor device. The method includes supplying a source gas to be adsorbed to a surface of a substrate; exhausting residual source gas which has not adsorbed to the surface of the substrate; irradiating light to the substrate to decompose molecules of the source gas adsorbed to the surface of the substrate and form a metal film made of atoms contained in the molecules of the source gas on the surface of the substrate; and introducing any of nitriding species and oxidizing species to nitride or oxidize the metal film.

Still another aspect of the present invention inheres in a semiconductor device. The semiconductor device include a substrate; an insulating film having a recessed portion in a surface thereof formed above the substrate; a metal film formed above the insulating film; an oxidized metal film of the metal film inserted between the insulating film and the metal film; a wiring metal film formed above the metal film; and a compound layer of the metal film and the wiring metal film inserted between the metal film and the wiring metal film. The diffraction intensity of the oxidized metal film by X-ray diffractometry is not more than ten times diffraction intensity of the compound layer.

BRIEF DESCRIPTION OF THE DRAWINGS

FIGS. 15A to 15C are cross-sectional views of the structure of an oxide film formed by the semiconductor device manufacturing method according to the first embodiment of the present invention;

FIG. 16A is a graph illustrating the result of analyzing a sample manufactured using related art, FIG. 16B is a graph illustrating the result of analyzing a sample manufactured at a stage temperature of 25° C. using the semiconductor device manufacturing method according to the first embodiment, FIG. 16C is a graph illustrating the result of analyzing a sample manufactured at a stage temperature of −20° C. using the semiconductor device manufacturing method according to the first embodiment, and FIG. 16D is a schematic diagram illustrating the structure of the samples used in analysis;

FIGS. 22A to 22C are examples of cross-sectional views illustrating the structures of Cu seed films formed by a semiconductor device manufacturing method according to a third embodiment of the present invention;

DETAILED DESCRIPTION OF THE INVENTION

Figure 1:
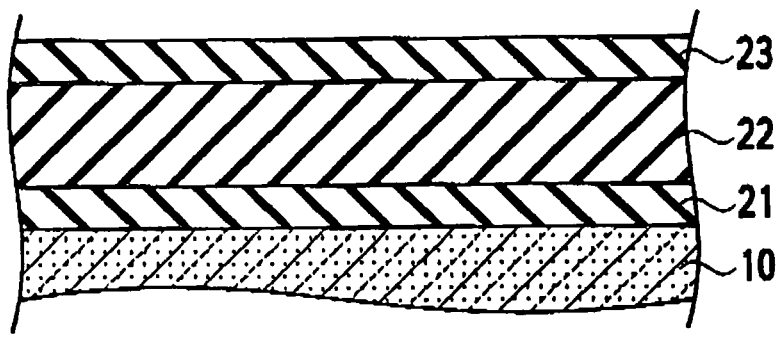
FIGS. 1 to 12 are cross-sectional views of manufacturing processes for explaining a semiconductor device manufacturing method according to a first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Generally and as it is conventional in the representation of semiconductor devices, it will be appreciated that the various drawings are not drawn to scale from one figure to another nor inside a given figure.

In the following descriptions, numerous specific details are set forth such as specific signal values, etc., to provide a thorough understanding of the present invention. However, it will be obvious to those skilled in the art that the present invention may be practiced without such specific details. In other instances, well-known circuits have been shown in block diagram form in order not to obscure the present invention in unnecessary detail.

First Embodiment

A semiconductor device manufacturing method according to a first embodiment of the present invention is a method in which oxide is formed on a surface of a metal film which is in contact with the interface between the metal film and an insulating film using gas emitted from the insulating film.

By referring to the FIGS. 1 to 12, a process for manufacturing a semiconductor device will be described. Hereinafter, a description will be given of the case where multi-level wiring having a dual damascene structure is formed using a Cu film as wiring material; a titanium (Ti) film as a barrier metal film; and a polyarylene ether (hereinafter abbreviated to PAE) film, which is a low-dielectric constant organic insulating film, a carbon-containing silicon oxide (hereinafter abbreviated to SiCO) film, which is a low-dielectric constant inorganic insulating film, and the like as insulating films.

A first PAE film 22 and a second $SiO_2$ film 23 are sequentially formed on a first silicon oxide ($Sio_2$) film 21 through which lower-layer electrodes electrically connected to semiconductor elements and the like in a semiconductor substrate 10 are exposed, thus obtaining the cross-sectional structure illustrated in FIG. 1.

Figure 2:
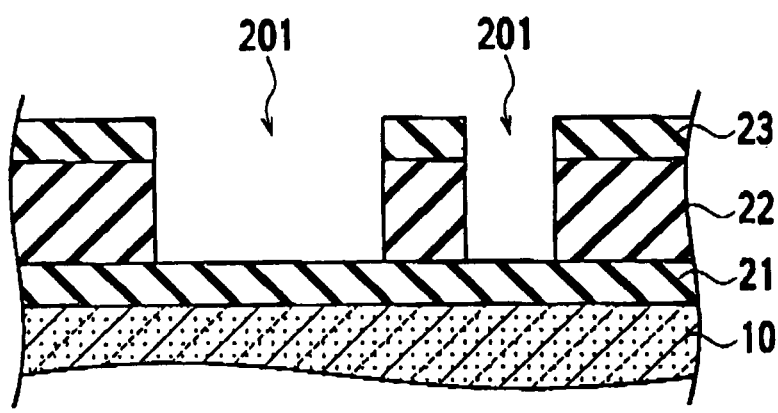
Figure 3:
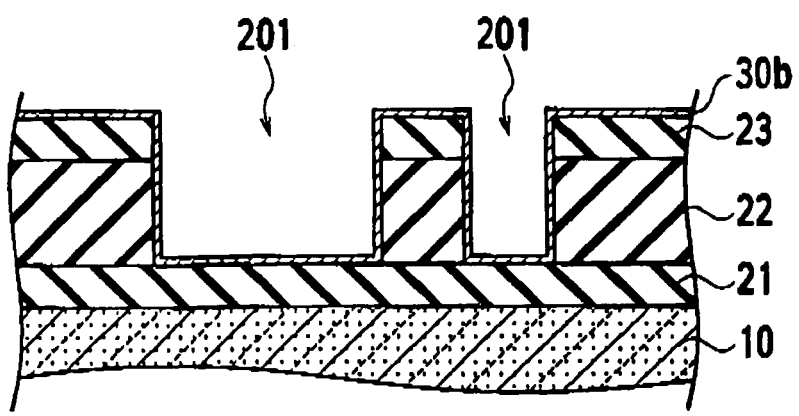

As illustrated in FIG. 2, the first PAE film 22 and the second $SiO_2$ film 23 are selectively etched using photolithography technology and reactive ion etching (RIE) or the like, thus forming first wiring trenches 201. Then, a first Ti film 30b is formed as a barrier metal film on the surface of the second $SiO_2$ film 23 and side surface portions and bottom portions of the first wiring trenches 201. The first Ti film 30b is formed with good step coverage. Thus, the cross-sectional structure illustrated in FIG. 3 is obtained.

Figure 4:
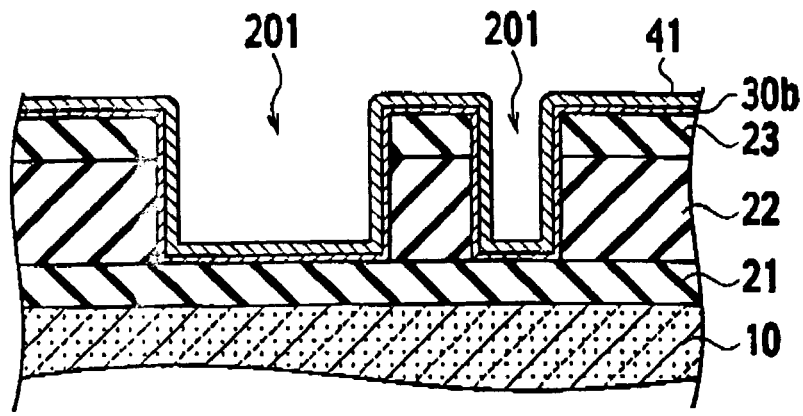
Figure 5:
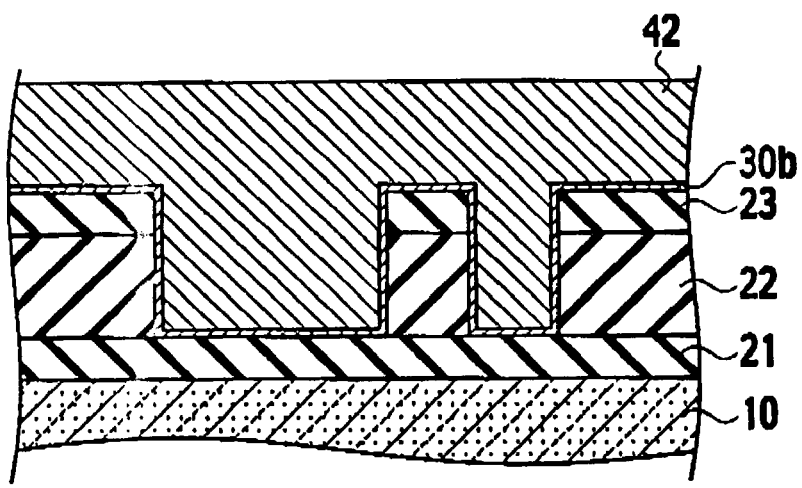
Figure 6:
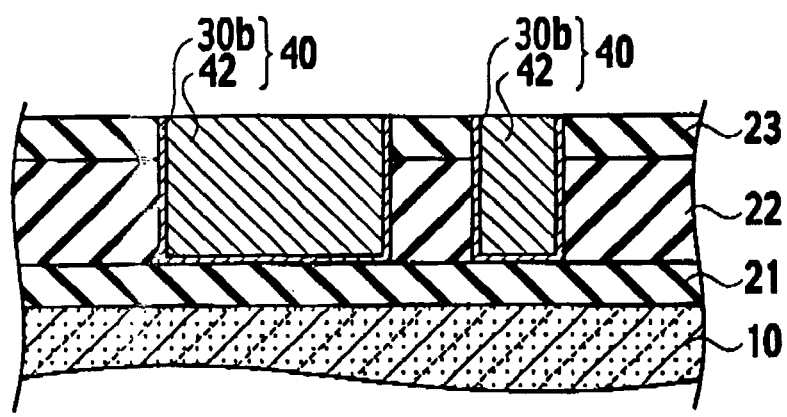

As illustrated in FIG. 4, a first Cu seed film 41 is formed at a temperature of, for example, not more than 25° C. under a continuous vacuum condition. A first Cu plated film 42 is formed using a plating machine to fill the first wiring trenches 201 (FIG. 5). A heat treatment process for increasing the particle size of Cu is performed beforehand in order to prevent variations in the quality of the Cu film which are caused by a change in the quality thereof with time due to self-aging and the like. Subsequently, the first Cu plated film 42 and the first Ti film 30b are planarized using chemical-mechanical polishing (CMP), whereby a first wiring layer 40 including the first Ti film 30b and the first Cu plated film 42 is formed as illustrated in FIG. 6.

Figure 7:
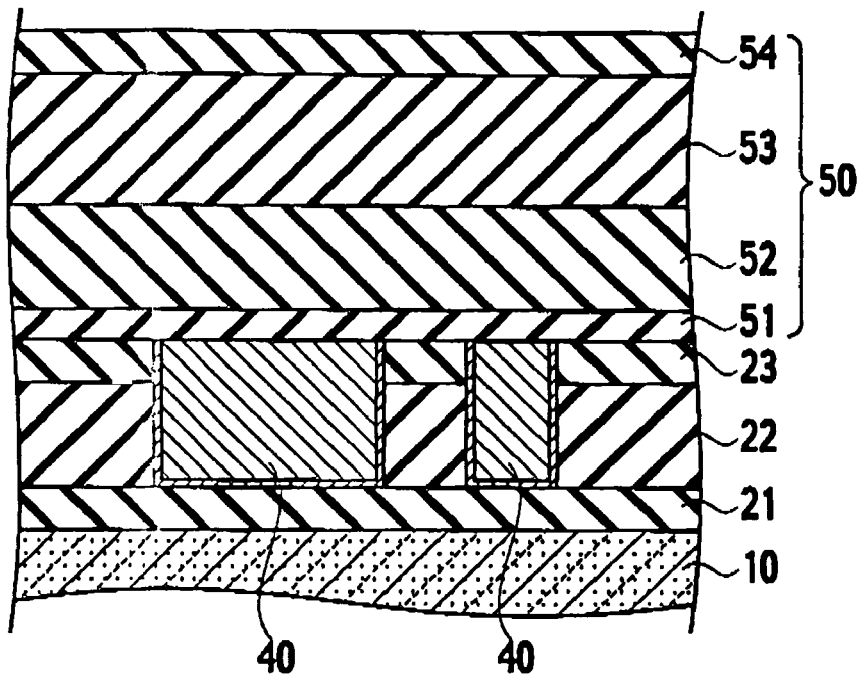

As illustrated in FIG. 7, a silicon carbonitride (SiCN) film 51, a SiCO film 52, a second PAE film 53, and a third $SiO_2$ film 54 are sequentially formed. The SiCN film 51 is formed as a stopper film used in a process using RIE and a film for preventing the diffusion of Cu. The third $SiO_2$ film 54 is formed as a protective film used in a process using CMP. The SiCN film 51, the SiCO film 52, the second PAE film 53, and the third $SiO_2$ film 54 constitute an inter-level insulating film 50.

Figure 8:
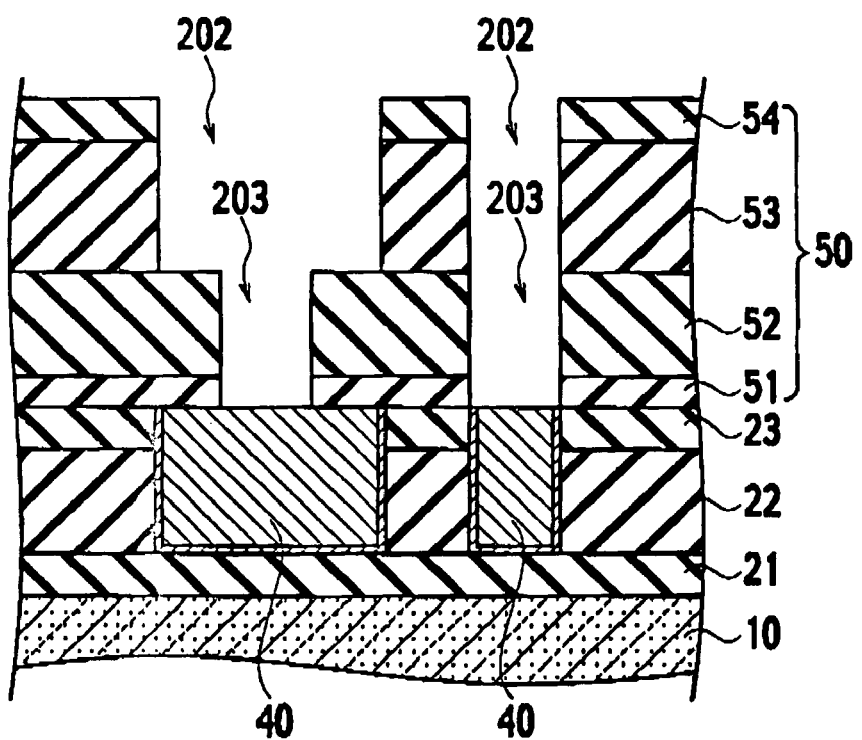
Figure 9:
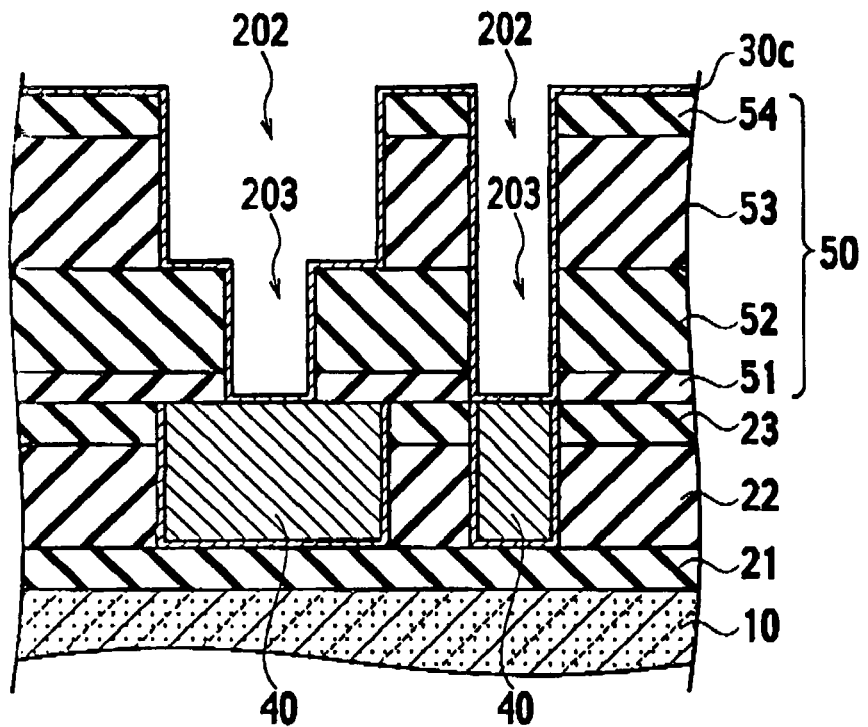

The inter-level insulating film 50 is selectively etched using photolithography technology and RIE to form second wiring trenches 202 and via holes 203. As a result, part of the surface of the first wiring layer 40 is exposed, as illustrated in FIG. 8. A second Ti film 30c is formed as a barrier metal film on the surface of the inter-level insulating film 50. The second Ti film 30c is formed with good step coverage. The cross-sectional structure illustrated in FIG. 9 is obtained.

Figure 10:
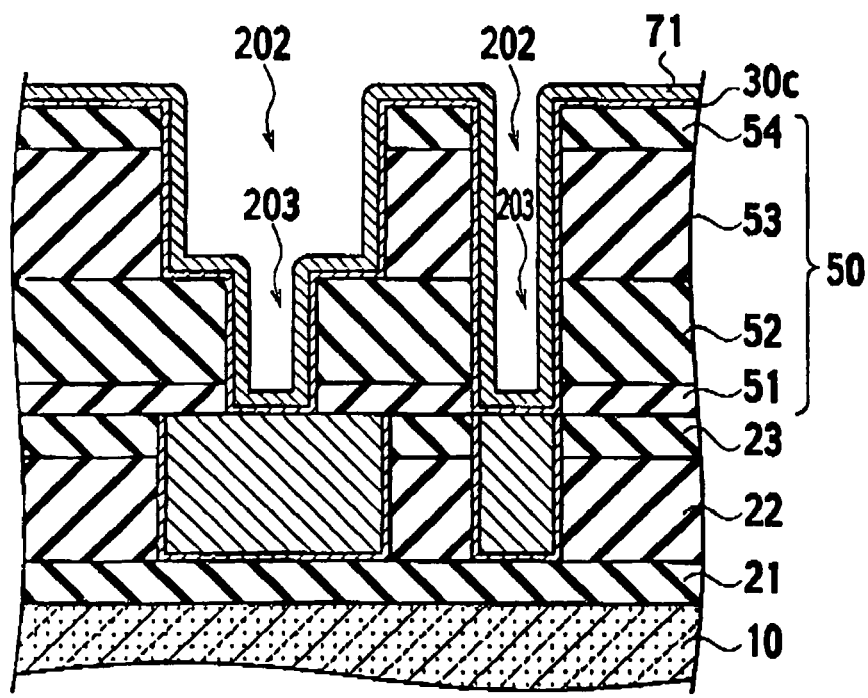
Figure 11:
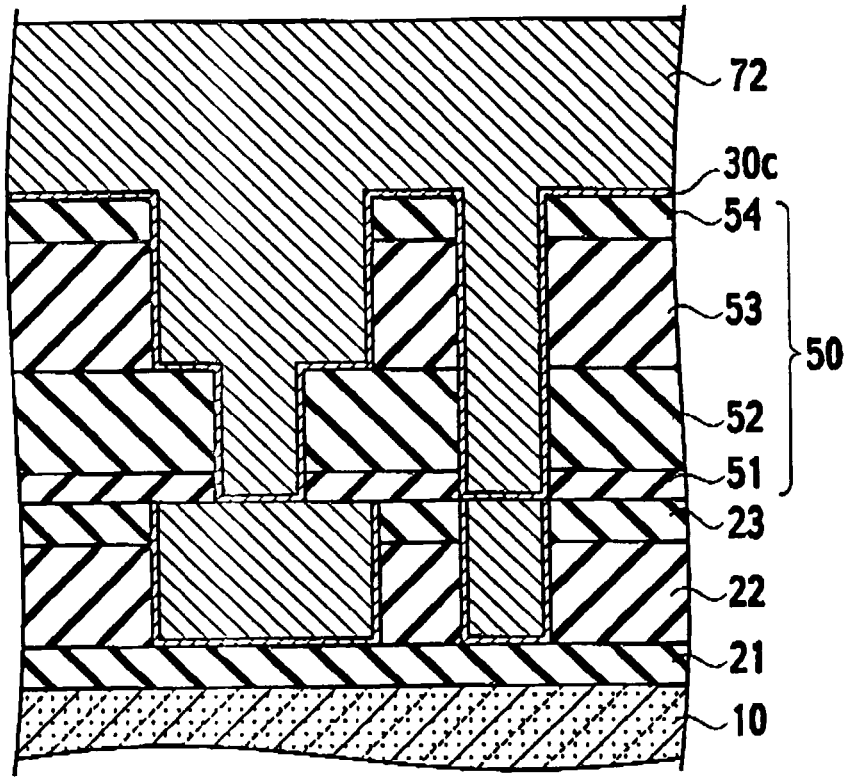
Figure 12:
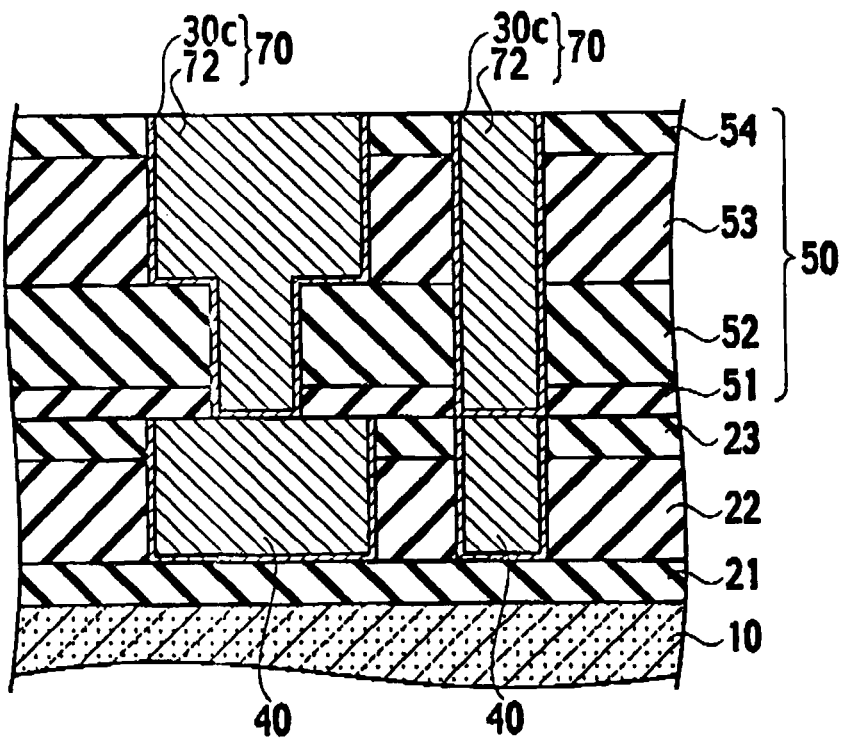

As illustrated in FIG. 10, a second Cu seed film 71 is formed under a continuous vacuum condition. A second Cu plated film 72 is formed using a plating machine so as to fill the second wiring trenches 202 and the via holes 203 (FIG. 11). A heat treatment process for increasing the particle size of Cu is performed beforehand in order to prevent variations in the quality of the Cu film which are caused by a change in the quality thereof with time due to self-aging and the like. Subsequently, the second Cu plated film 72 and the second Ti film 30c are planarized using CMP, whereby a second wiring layer 70 including the second Ti film 30c and the second Cu plated film 72 is formed as illustrated in FIG. 12. To further form multi-level wiring, the processes of FIGS. 7 to 12 are repeated.

Hereinafter, an example of the semiconductor device manufacturing method according to the first embodiment will be described. In the description below, an example will be described in which the inter-level insulating film 50 illustrated in FIG. 7 and the second Ti film 30c illustrated in FIG. 9 are formed. The SiCN film 51 can be employed as a stopper film on the first wiring layer 40; the SiCO film 52 and the second PAE film 53 can be employed as an inter-level insulating film; and the third $SiO_2$ film 54 or the like can be employed as a protective film used in a process using CMP. It is acceptable to form only the SiCO film 52 or only the second PAE film 53 as an inter-level insulating film. In the case where a highly-hygroscopic porous film is used as at least one insulating film in the inter-level insulating film including a plurality of kinds of insulating films, the amount of oxidizing species emitted from the insulating film becomes large. The "porous film" is a film containing many vacancies in order to lower the dielectric constant. In the case where oxide is formed on the surface of a metal film using gas emitted from an insulating film, it is very effective to use an insulating film containing oxidizing species such as water and particularly having a relative dielectric constant of not more than three.

As illustrated in FIG. 8, the inter-level insulating film 50 is selectively etched using photolithography technology and RIE, thus forming the second wiring trenches 202 and the via holes 203. Heat treatment is performed under a vacuum condition or a reducing atmosphere such as $H_2$ gas to a temperature of, for example, not less than 250° C. nor more than 300° C. Such heat treatment removes $H_2O$ contained in the inter-level insulating film 50 or carbon-based residues and the like of which bonds have been broken during the formation of the second wiring trenches 202 and the via holes 203 and which remain in the inter-level insulating film 50. If the heat treatment is performed in a reducing atmosphere, reduction treatment can also be performed on oxide films on the surface of the first wiring layer 40 which are exposed at bottom portions of the via holes 203.

Figure 13:
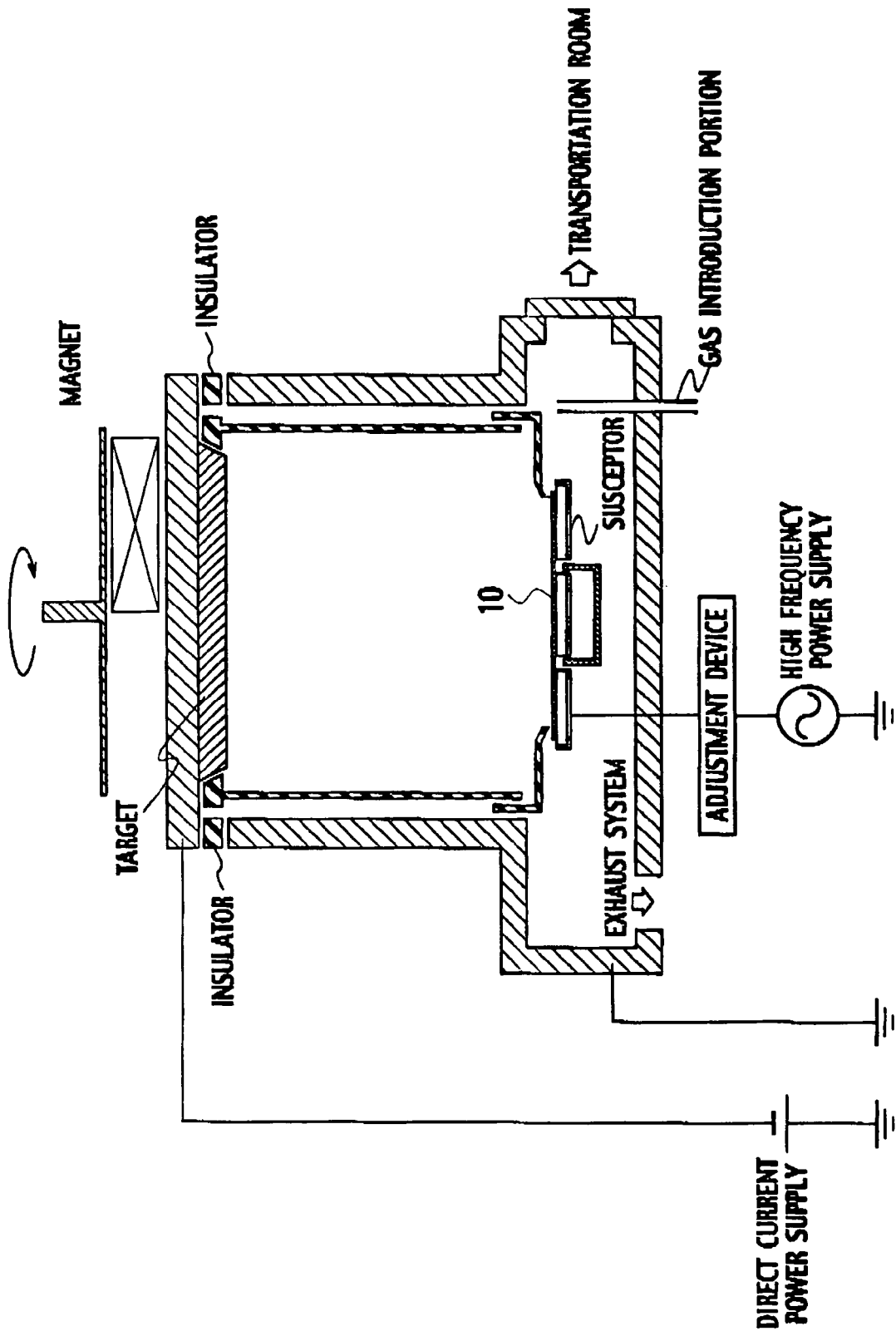
FIG. 13 is an example of semiconductor manufacturing apparatus which performs the semiconductor device manufacturing method according to the first embodiment of the present invention.

The substrate 10 is transported under a continuous vacuum condition to the inside of an ionized-sputtering chamber, for example, as illustrated in FIG. 13, which is used to form a barrier metal film. The substrate 10 is placed on a susceptor set at a temperature of, at most, not more than the heating temperature of the process of degassing the inter-level insulating film 50, preferably not more than room temperature. The substrate 10 is held on the susceptor by vacuum, and the temperature of the substrate 10 is maintained at a temperature equivalent to that of the susceptor.

As described with FIG. 9, the second Ti film 30c is formed by a method such as ionized sputtering. In the case where the second Ti film 30c is formed using normal plasma, the temperature of the substrate 10 generally increases during the formation of the second Ti film 30c. Accordingly, the temperature of the substrate 10 during the formation of the second Ti film 30c is controlled so as not to exceed the temperature of degassing or $H_2$-reduction heat treatment performed before the formation of the second Ti film 30c. For example, the temperature of the substrate 10 is controlled so as not to exceed 250° C. if degassing or $H_2$-reduction heat treatment has been performed at 250° C., or so as not to exceed 300° C. if degassing or $H_2$-reduction heat treatment has been performed at 300° C.

The substrate 10 is transported to a chamber for Cu film formation under a continuous vacuum condition and cooled to a temperature not more than room temperature, and the second Cu seed film 71 is formed (see FIG. 10). The second Cu seed film 71 is formed by PVD, CVD, ALD, or the like so as to have a desired film thickness, e.g., a film thickness of approximately 60 nm. The substrate 10 is exposed to air and, as illustrated in FIG. 11, the via holes 203 and the second wiring trenches 202 are filled with the second Cu plated film 72 by plating. Subsequently, a heat treatment process (post-plating anneal) for increasing the particle size of Cu is performed beforehand in order to prevent variations in the quality of the second Cu plated film 72 which are caused by a change in the quality thereof with time due to self-aging and the like. The post-plating anneal is performed in any one of a vacuum, a nitrogen ($N_2$) gas atmosphere, and a $N_2/H_2$ gas atmosphere under conditions in which temperature and time are respectively 150° C. and 60 minutes, 300° C. and 60 minutes, or the like. As to conditions for the post-plating anneal, optimum temperature and optimum time change with plating conditions. The second Cu plated film 72 is planarized by CMP, thus forming a dual damascene structure.

Figure 14A:
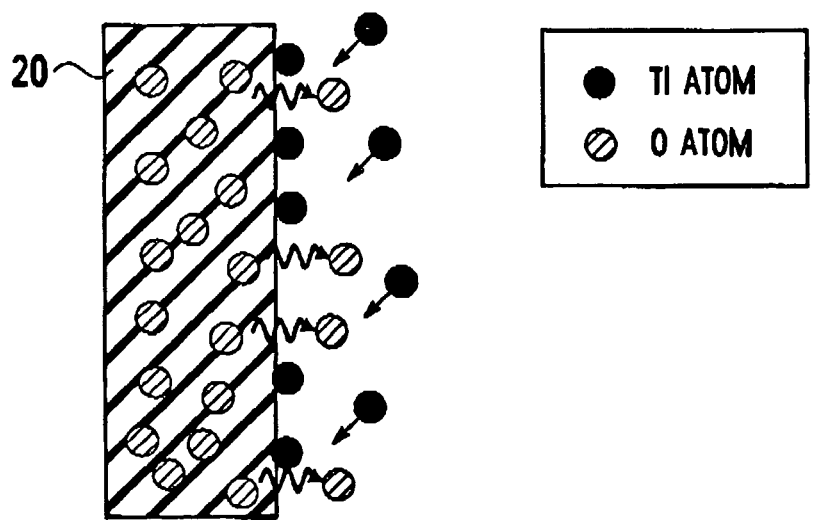
FIGS. 14A to 14C are cross-sectional views of the structure of an oxide film formed by related art.
Figure 14B:
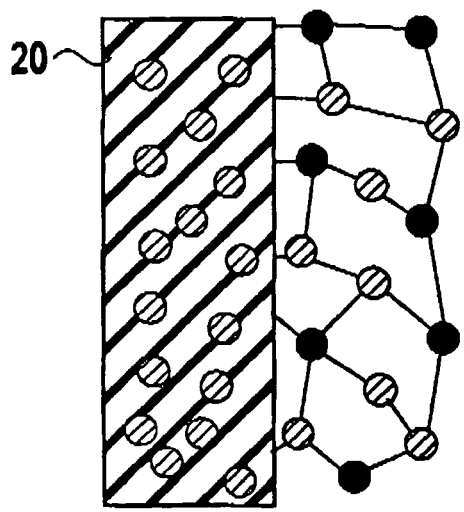
Figure 14C:
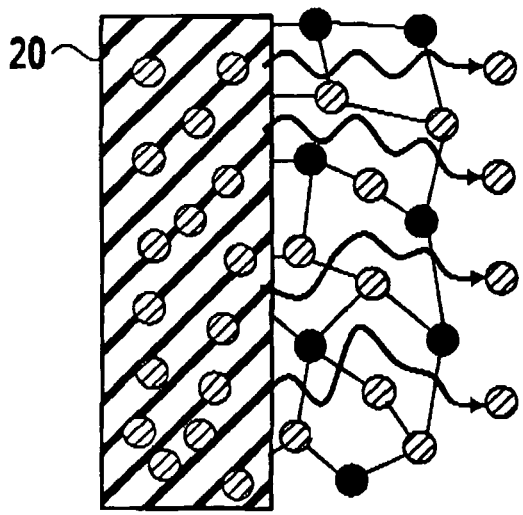

Hereinafter, Ti oxidation in the formation of a Ti film will be described. As described previously, a low-dielectric constant insulating film has many vacancies in order to reduce the dielectric constant. Accordingly, when the substrate 10 is heated, oxidizing species such as water and oxygen contained in the vacancies of the insulating film are emitted from the side surfaces of the trenches or the via holes. As illustrated in FIG. 14A, when oxidizing species are emitted in a process in which Ti atoms as sputtered particles come flying, the Ti atoms bond to oxygen to form titanium oxide (TiOx). In such case, the Ti atoms bond to oxygen in a state in which the Ti atoms are not bonded to each other, and therefore the Ti—O interatomic distance is large. This is because, since Ti particles come flying in atomic or molecular states to form oxide in a state in which sufficient oxidizing reaction easily occurs, oxide is formed in which stable bonds are formed and which has a relatively large valence. A TiOx film formed on the surface of an insulating film 20 by repeating the above-described film formation process is a TiOx film having a large Ti—O interatomic distance and a low molecular concentration (see FIG. 14B). Moreover, as illustrated in FIG. 14C, the TiOx film having a low molecular concentration cannot prevent oxidizing species remaining in the insulating film 20 from being further emitted. Thus, the entire Ti film is ultimately formed as a TiOx film having a low molecular concentration. The TiOx film having a low molecular concentration has poor adhesion to a Cu film. Accordingly, in the case where a Cu film is buried as wiring material in trenches or via holes, the interface diffusion of Cu atoms occurs at the TiOx/Cu interface. In other words, the SM resistances of Cu interconnections are low, and therefore voids occur in the interconnections.

In the case where a Ti film is formed at a temperature lower than that of a degassing process, oxidizing species are not emitted from the insulating film 20 as illustrated in FIG. 15A.

Accordingly, as illustrated in FIG. 15B, a pure Ti film 30a not containing TiOx and the like is formed as a barrier metal film. After the degassing process, in the case where the substrate 10 is heated to a temperature higher than a temperature of the degassing in an insulating film formation process, a sintering process, or the like after the formation of the Ti film, oxidizing species remaining in the insulating film 20 are emitted. As a result, a surface of the Ti film which is in contact with the insulating film 20 is oxidized. However, since Ti—Ti bonds are formed in the Ti film, the oxidation of Ti proceeds due to the diffusion of oxygen into spaces between Ti atoms and the solid solution of oxygen therein. Accordingly, a TiOx film having a high molecular concentration is formed (see FIG. 15C). The TiOx film having a high molecular concentration prevents oxidizing species from being emitted from the insulating film 20. Thus, the oxidation of the Ti film is limited to a region in the vicinity of the interface between the insulating film 20 and the Ti film, and the Ti film is prevented from being oxidized in a region far from the interface. In other words, with the semiconductor device manufacturing method according to the first embodiment, a semiconductor device can be realized in which in a metal film in contact with both of a wiring metal film and an insulating film, the atomic, or molecular concentration of metal in a portion of the metal film that is in contact with the insulating film is higher than the atomic or molecular concentration of metal in a portion of the metal film that is in contact with the wiring metal film and the concentration of metal gradually changes. In the case of the semiconductor device illustrated in FIGS. 1 to 12, in the second Ti film 30c in contact with both of the second Cu plated film 72 and the inter-level insulating film 50, the atomic or molecular concentration of Ti in a portion of the second Ti film 30c which is in contact with the inter-level insulating film 50 is higher than the atomic or molecular concentration of Ti in a portion of the second Ti film 30c which is in contact with the second Cu plated film 72, and the Ti atomic concentration of the second Ti film 30c gradually changes.

With the semiconductor device manufacturing method according to the first embodiment, a Ti film at a Ti/Cu interface is prevented from being oxidized at the time that trenches or via holes are filled with a Cu film, by specifying the relation between the temperatures of a degassing process and a barrier metal film formation process. Further, in a process after the formation of the Ti/Cu interface in which favorable adhesion can be ensured, the oxidation of barrier metal occurs in a state in which the aforementioned difference in molecular concentration exists. As a result, the adhesion of the Ti/Cu interface is maintained, and the SM resistance of the Cu film does not deteriorate. Moreover, the TiOx film having a high molecular concentration not only prevents oxidizing species from being emitted from the insulating film 20 but also prevents Cu from diffusing into the insulating film 20. The semiconductor device manufacturing method according to the first embodiment of the present invention is extremely effective especially for the insulating film 20 having a relative dielectric constant of not more than 3.

Figure 16A:
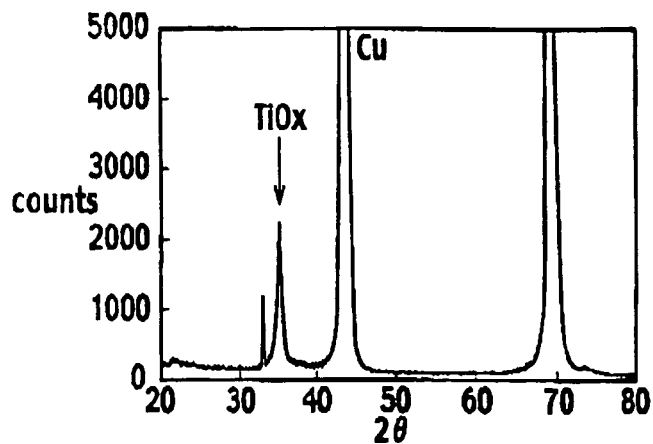
FIGS. 16A to 16D are results of analyzing samples subjected to heat treatment to 370° C. for 60 minutes by X-ray diffractometry.
Figure 16B:
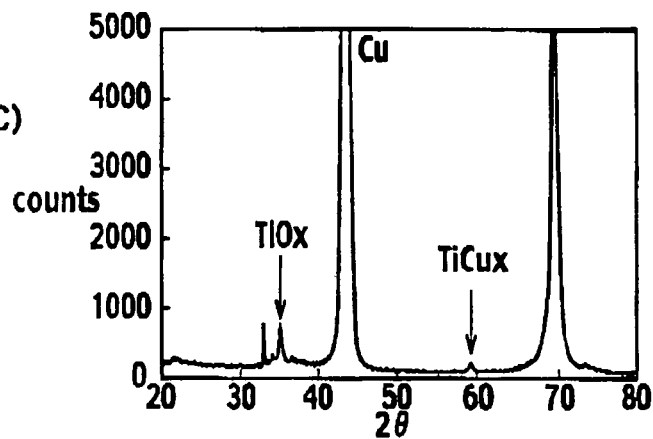
Figure 16C:
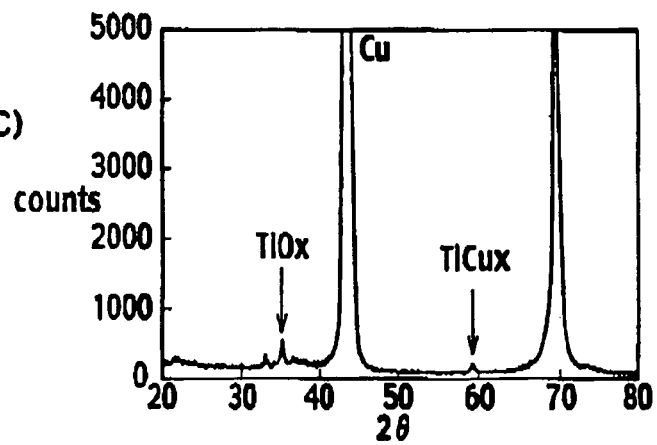
Figure 16D:
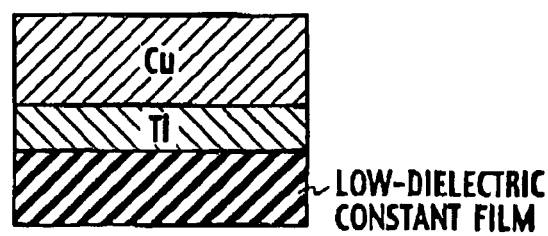

Results of analyzing samples prepared by the semiconductor device manufacturing method according to the first embodiment are illustrated in FIGS. 16A to 16D. FIGS. 16A to 16D are results of measuring samples manufactured using the semiconductor device manufacturing method according to the first embodiment of the present invention and a sample manufactured by related art, by 2θ-θ X-ray diffractometry. FIG. 16A is a result of measuring the sample manufactured by the related art. FIGS. 16B and 16C are results of measuring the samples manufactured by the semiconductor device manufacturing method according to the first embodiment. It should be noted that each of the stage temperatures in FIGS. 16B and 16C is the temperature of a stage at the time of Ti film formation but not the temperature of a substrate. In FIGS. 16A to 16C, the horizontal axis is 2θ in measurement, the vertical axis is intensity, and the unit of the vertical axis is cps (counts per sec).

From FIG. 16A, the peak intensity of a TiOx film of the sample formed by the related art is 2182 cps. From FIGS. 16B and 16C, the peak intensities of TiOx films of the samples formed by the semiconductor device manufacturing method according to the first embodiment of the present invention are 706 cps for a stage temperature of 25° C. and 543 cps for a stage temperature of −20° C. In other words, the peak intensity of the TiOx film of the sample formed by the related art is larger than the peak intensity of the TiOx films of the samples formed by the semiconductor device manufacturing method according to the first embodiment of the present invention. In the case of the related art, it is considered that a Ti film is oxidized by oxidizing species emitted from a low-dielectric constant insulating film during the formation of the Ti film, oxidizing species are not prevented from being emitted in a heat treatment process such as a sintering process, and the oxidation of the Ti film proceeds.

In the semiconductor device manufacturing method according to the first embodiment, a Ti film is prevented from being oxidized during the formation of the Ti film. Accordingly, it is considered that a TiOx film having a high molecular concentration is formed in a heating process after the formation of the Ti film, and that the Ti film is prevented from being further oxidized. Further, from FIGS. 16B and 16C, it can be seen that in the semiconductor device manufacturing method according to the first embodiment of the present invention, a TiCux film is formed in a region in which the Ti film and a Cu film are in contact with each other because not the entire Ti film is oxidized. From FIGS. 16B and 16C, the peak intensities of the TiCux films are 224 cps for a stage temperature of 25° C. and 210 cps for a stage temperature of −20° C. In the related art, as illustrated in FIG. 16A, the peak intensity of a TiCux film is 108 cps, which is almost equivalent to the intensity of the background or at an unmeasurable level. From the above-described result, it is considered that in the related art, the formed volume of a TiCux film is very small or a TiCux film is not formed.

As a result of performing many experiments and diligently conducting research by the present inventors, it was revealed that the reliability of a semiconductor device deteriorates when the peak intensity of the TiOx film exceeds 10 in the case where the peak intensity of the TiCux film is assumed to be one by 2θ-θ X-ray diffractometry. By controlling a formation ratio so that not the TiOx film but the TiCux film is largely formed, the TiCux film serves as a layer adhering to the Cu film and the Ti film, thus greatly improving the SM resistance and EM resistance of the Cu film. A Cu film, a Ti film, and a low-dielectric constant insulating film of the sample, which has constitution illustrated in FIG. 16D correspond to the second Cu plated film 70, the second Ti film 30c, and the inter-level insulating film 50 of FIG. 12, respectively. Accordingly, with semiconductor manufacturing apparatus according to the first embodiment of the present invention, a semiconductor device can be realized which has a stacked structure including an insulating film, a metal film, and a wiring metal film stacked in such order on a substrate, and in which the diffraction intensity of oxide of the metal film by X-ray diffractometry performed on the stacked structure is not more than ten times the diffraction intensity of a compound of the metal film and the wiring metal film. For example, as illustrated in FIG. 12, a semiconductor device can be manufactured which has a stacked structure including the inter-level insulating film 50, the second Ti film 30c, and the second Cu plated film 70 stacked in this order on the substrate 10, and in which the diffraction intensity of Ti oxide by X-ray diffractometry performed on the stacked structure is not more than ten times the diffraction intensity of a compound of the second Ti film 30c and the second wiring layer 70.

Multi-level wiring is formed by repeating the processes described in FIGS. 1 to 12 and, after the processes, Cu pads or Al pads for electrodes are formed. Then, multi-level anneal is performed as a last process. If the formation of the second Ti film 30c is performed at temperatures not more than that at which a degassing process is performed under a vacuum condition or a reducing atmosphere such as $H_2$ gas, CVD or ALD can be employed other than PVD as a method for forming the second Ti film 30c.

Generally, to sufficiently remove $H_2O$, OH groups, or free carbon-based gas contained in the low-dielectric constant insulating film in a short time, heating to a temperature of 350° C. to 400° C. is necessary in the degassing process. Accordingly, in the case where degassing or $H_2$-reduction heat treatment is performed at 250° C. to 300° C. as in the aforementioned method, $H_2O$, OH groups, and free carbon-based gas of amounts corresponding to a difference in thermal budget remain in the inter-level insulating film 50. A solid phase reaction between the second Ti film 30c and the remaining oxidizing species or carbon-containing free radicals causes the oxidation (hereinafter referred to as "Ti post-oxidation") of the second Ti film 30c in the vicinity of the interface between the inter-level insulating film 50 and the second Ti film 30c.

Ti post-oxidation also occurs at a temperature lower than 300° C., which is an upper limit to temperature in the aforementioned degassing process. This is because the diffusion of $H_2O$ proceeds even at a temperature not more than 300° C. depending on the concentration gradient of oxidizing species contained in the inter-level insulating film 50. Further, a heat treatment process of actively performing Ti post-oxidation of the second Ti film 30c may be performed after the formation of multi-level wiring. Alternatively, Ti post-oxidation can be performed at a temperature of 250° C. to 300° C. at the time of anneal in a process for stabilizing the quality of the second Cu plated film 72. Moreover, it is also effective to perform a heat treatment process for performing Ti post-oxidation before the process of forming the second Cu plated film 72. For example, PVD for the formation of the second Cu seed film 71 is generally performed at a temperature not more than room temperature. However, in the case where CVD or ALD is used for the second Cu seed film 71, Ti post-oxidation can be performed by setting the temperature at which the second Cu seed film 71 is formed higher than the temperature at which the second Ti film 30c is formed.

As described in a Ti—O binary phase diagram, the solid solubility of oxygen in Ti oxide formed by the solid phase diffusion/solid phase oxidation reaction of a Ti film is higher than the solid solubility of oxygen in other metallic materials. Accordingly, in an oxygen solid solution region, the weight molecular concentration of the Ti oxide is higher than 4.507 g/cm$^3$, which is the weight atomic concentration of pure Ti. For example, the weight molecular concentration of titanium (II) oxide (TiO) is 4.93 g/cm$^3$, and the weight molecular concentration of titanium pentoxide ($Ti_3O_5$) is 4.6 g/cm$^3$. Even titanium oxide $TiO_2$, which is formed in the case where the oxygen concentration is as high as 60 atomic percent, has a weight molecular concentration of 4.26 g/cm$^3$, which is not less than 80% of the weight atomic concentration of Ti atoms, Magnesium (Mg) has characteristics similar to characteristics of Ti. The weight molecular concentration of Mg oxide is higher than the weight atomic concentration of pure Mg. Using as a barrier metal film a material having characteristics which allow oxygen to be dissolved therein to form a solid solution as described above is effective in blocking oxidizing species emitted from an insulating film because oxide formed has a high molecular concentration. Furthermore, a result of an experiment revealed that metal oxide having a molecular concentration not less than 80% of the atomic concentration of pure metal is more desirable for blocking oxidizing species emitted from an insulating film.

As described previously, if a barrier metal film is oxidized after a portion adhering to a Cu film and the barrier metal film has been formed, a Ti film remains in part of a region including a portion for maintaining adhesion to the Cu film, and adhesion between the Cu film and the Ti film does not deteriorate. With the semiconductor device manufacturing method according to the first embodiment, a semiconductor device can be realized in which in a metal film in contact with both of a wiring metal film and an insulating film, the atomic or molecular concentration of metal in a portion sandwiched between the wiring metal film and the insulating film is higher than the atomic or molecular concentration of metal in a portion of the metal film that is in contact with the wiring metal film and the atomic or molecular concentration of metal in a portion of the metal film that is in contact with the insulating film. In the case of the semiconductor device illustrated in FIGS. 1 to 12, by making the slope which met in the direction of film thickness to the oxygen concentration in the second Ti film 30c, a semiconductor device is manufactured in which in the second Ti film 30c in contact with both of the second Cu plated film 72 and the inter-level insulating film 50, the atomic or molecular concentration of Ti in a portion sandwiched between the second Cu plated film 72 and the inter-level insulating film 50 is higher than the atomic or molecular concentration of Ti in a portion of the second Ti film 30c that is in contact with the second Cu plated film 72 and the atomic or molecular concentration of Ti in a portion of the second Ti film 30c that is in contact with the inter-level insulating film 50.

Figure 17:
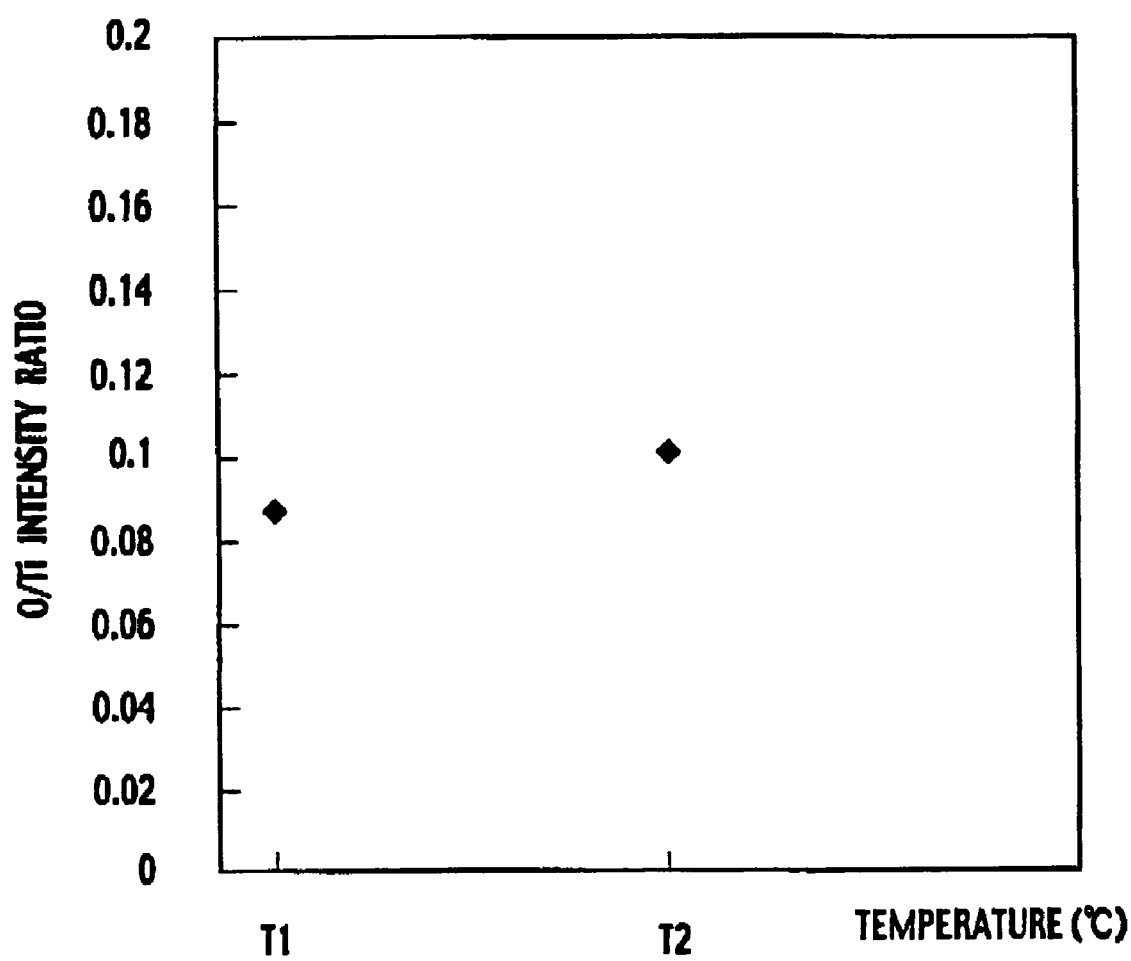
FIG. 17 is an example of a graph showing EELS analysis results of the titanium oxides manufactured using the semiconductor device manufacturing method according to the first embodiment of the present invention and related art, respectively.

The example method for checking an intensity ratio O/Ti of the TiOx film, which is formed in the vicinity of the interface between the insulating film and the Ti film, and an intensity ratio O/Ti of the Ti film in contact with the Cu film after Ti post-oxidization are shown in the following. A sample for transmission electron microscope (TEM) analysis is made. TEM-electron energy-loss spectroscopy (EELS) analysis of the analysis sample is performed. The samples for analysis are manufactured by both of the semiconductor device manufacturing method according to the first embodiment and the related art, respectively. Film thickness of the analysis sample manufactured by each manufacturing method is the same. By EELS analysis, Ti intensity and oxygen intensity of the analysis sample, of which films are formed at the room temperature for example, are acquired. By observation of a side wall of the trench formed in a surface of the analysis sample, the intensity ratio O/Ti of the portion in contact with in the Cu film is lower than the intensity ratio O/Ti of the portion in contact with in the insulating film. The intensity ratio O/Ti of the portion in contact with in the Cu film is less than 0.12 (about 0.11). The result of evaluating the ratio of Ti intensity and oxygen intensity by EELS analysis of the Ti film of the part at side wall of a via hole of the analysis sample with which TEM analysis was performed is illustrated in FIG. 17. In FIG. 17, a temperature Ti is the substrate temperature in the case where a barrier metal film is formed by the semiconductor device manufacturing method according to the first embodiment, for example, the temperature Ti is 25° C. A temperature T2 is the substrate temperature in the case where a barrier metal film is formed by the related art. As illustrated in FIG. 17, the intensity ratio O/Ti is not more than 0.1.

As stated above, the intensity ratio O/Ti of the portion in which is contact with the Cu film is less than 0.12. The TiOx film of an interface between the Cu film and the Ti film of the portion is removed and the thickness of the Ti film hardly changes in the portion. Therefore, it is guessed that the intensity ratio O/Ti in the state where the oxygen is dissolved in the Ti film is less than 0.12. If it assumes that the intensity ratio O/Ti obtained by EELS analysis corresponds to the ratio of the number of atoms, the above intensity ratio O/Ti is the same as the solid solubility of the oxygen of the analysis sample in the process highest temperature (400° C.). In the case where the highest anneal temperature in Ti post-oxidation process or the subsequent process is 420° C., the solid solubility is 0.123 as the number ratio of O/Ti atoms, in the case where the highest anneal temperature is 450° C., the solid solubility is 0.15 as the number ratio of O/Ti atoms.

As described above, there is almost no concentration change of Ti by the influence of the oxygen in the Ti film, and an increase of the diffusion path by grain in the TiOx film is prevented, unlike the material of oxidization formation, such as Tantal (Ta) film. As explained above, oxygen by the oxidizing species emitted from the insulating film during the Ti post-oxidation process is contained in the TiOx film. However, since a compound is formed in the interface between the Ti film and the Cu film during the Ti post-oxidation process, the adhesion of the Ti film and the Cu film is ensured.

Figure 18:
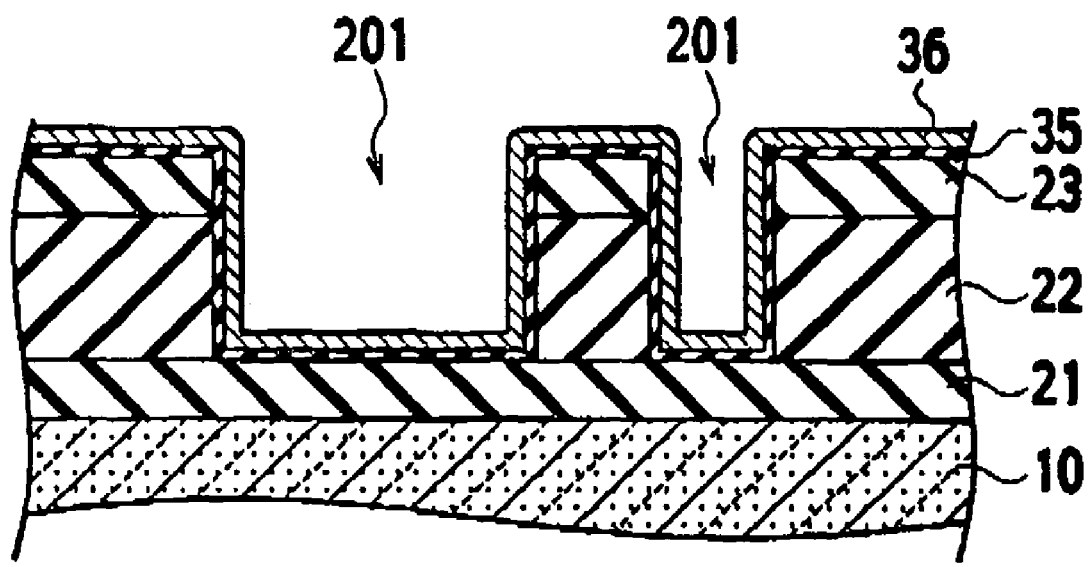
FIG. 18 is an example of a cross-sectional view illustrating the structure of a semiconductor device manufactured using the semiconductor device manufacturing method according to the first embodiment of the present invention.

Further, even if the Ti film is entirely oxidized, adhesion between the Ti film and the Cu film does not deteriorate because the compound of Ti and Cu has already been formed in the interface of Ti film and Cu film. Moreover, the process of forming an additional Ti film may be performed after some or all of the Ti film is oxidized. Furthermore, a film made of metal different from Ti, such as tantalum (Ta) in which the solid solubility of oxygen is low, may be formed after some or all of the Ti film is oxidized. A metal film of Ta or the like formed on Ti oxide having a high concentration functions effectively as a layer adhering to the Cu film. In this case, since the Ti oxide existing between the Ta film and an insulating film blocks oxidizing species such as $H_2O$ emitted from the insulating film, the Ta film is prevented from being oxidized. Accordingly, the Ta film is more stably used as a barrier metal film than used singly. FIG. 18 illustrates an example in which a Ta film 36 is formed on a titanium oxide (TiOx) film 35. Potential materials in which the solid solubilities of oxygen are high include Ti, Mg, zirconium (Zr), and vanadium (V). The metal film formed on the Ti film is selected from among the metal films which are hard to be oxidized or metal films with the sufficient adhesion of the oxide thereof and the Cu film, such as ruthenium (Ru), palladium (Pd), platinum (Pt) and gold (Au).

In stated above, post-oxidation of the material, which is easy to dissolve oxygen in the interface with the insulating film (for example, Ti), is explained as a desirable form. However, for example, it is also possible that the mixed film is formed as a barrier metal film using the target of an alloy and the barrier metal film is oxidized in a post-oxidization process. The alloy includes TiRux, TiPdx, TiPt, TiAux, and the like. With the above-mentioned alloy, the Ti, especially a part of the Ti in contact with the interface with the insulating film, is oxidized previously. Therefore, it is possible to acquire the same effect as the above-mentioned example.

Figures 19, 20:
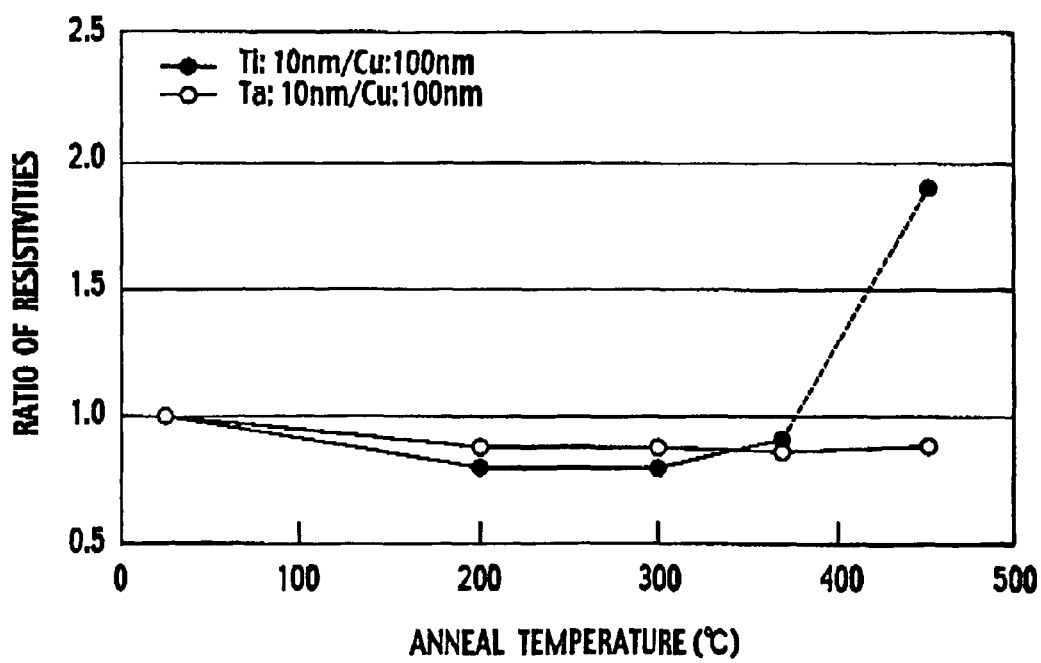
FIG. 19 is an example of a table showing SIMS results of a wiring manufactured using the semiconductor device manufacturing method according to the first embodiment of the present invention.
FIG. 20 is an example of a graph showing a ratio of resistivity after anneal as opposed to resistivity before anneal of wiring manufactured using the semiconductor device manufacturing method according to the first embodiment of the present invention.

A desirable condition is shown in the following as a heat treatment condition of the Ti post-oxidation. There is the following effect depended on effects of forming the compound of the barrier metal film of Ti and Cu film, in addition to improvement SM resistance and the EM resistance in the already described. A diffusion of Cu atoms is prevented by existence of Ti atoms in the Cu film, particularly Ti atoms exist near Cu grain. However, the temperature 150° C. of a heat treatment process is insufficient to acquire the effect of preventing diffusion of Cu atoms within time of a realistic manufacturing process, for example, thirty minutes or one hour. A heat treatment process 200° C. or more is required to acquire the effect. The result of secondary ion mass spectroscopy (SIMS) of a sample manufactured by the following method is illustrated in FIG. 19. 10 nm of Ti films is formed by the ionization PVD method. 46 nm of Cu seed films is formed on the Ti film by the ionization PVD method. Then, 120 nm of Cu films is formed using the electro chemical plating (ECP) equipment for copper wiring. The samples are heat-treats in the reduction atmosphere of H2 gas for one hour at each temperature illustrated in FIG. 19, which is imitation of a heat treatment process of the Ti post-oxidization. FIG. 19 shows the maximum concentration of Ti in the Cu film within 0.2 nm form Ti/Cu interface of the samples. As illustrated in FIG. 19, it is effective for preventing diffusion of Cu atoms by diffusing Ti atoms in the Cu film that heat treatment temperature exceeds 150° C.

As stated above, it is desirable that heat treatment temperature exceeds 150° C. in order to add Ti atoms in the Cu film by diffusion of Ti atoms. However, the compound formed in the Ti/Cu interface restricts the Ti diffusion, and the required effect achieved by adding Ti atoms to the Cu film may not be acquired. A lot of Ti atoms are added to the Cu film and a lot of compounds are formed in the Ti/Cu interface by heat treatment at high temperature first, and the post-oxidation by the oxidizing species emitted from the insulated film may be influenced.

In order to control formation of the compound, the heat treatment is performed at the first heating temperature so that the compound of the Ti/Cu interface does not restrict diffusion of Ti atoms from the Ti film to the Cu film. Ti atoms are added in the Cu film and Ti oxide is formed in the interface of the insulating film and Ti film by oxidizing species emitted from the insulating film by the heat treatment at the first heating temperature. The compound of Ti/Cu is formed by heat treatment at the second heating temperature higher than the first heating temperature for improving the adhesion between the Ti film and the Cu film. Above heat processes including the heat treatments at the first and second heating temperature is desirable for the post-oxidation process. By above heat processes, adjustment with control of diffusion of Ti atoms and formation of the compound layer of a Ti/Cu interface can be performed effectively, and the oxide layer of the insulating film and the Ti film interface is formed in early stages of a manufacturing process. Therefore, there is an effect that supply of oxygen is controllable with the oxide layer, in the high temperature processing after oxide layer formation.

Although the advantageous characteristic of a TiOx film is acquired by oxidization of Ti film, resistance of damascene interconnection increases by the superfluous reaction of the Ti film and the Cu film at high temperature of a heat treatment process. The example of the ratio of the resistivity after an anneal process to the resistivity before the anneal process of the sample which imitated damascene wiring is illustrated in FIG. 20. The sample, of which change of the resistivity showed in FIG. 20, has 10 nm barrier metal film and 100 nm Cu film, which are formed by the ionization PVD method, and the sample is heated in hydrogen/argon atmosphere. The ratio of resistivity illustrated in FIG. 20 by the black dot is a ratio of resistivity in case a barrier metal film is Ti film. The ratio of resistivity illustrated in FIG. 20 by the white dot is a ratio of resistivity in case a barrier metal film is Ta. As illustrated in FIG. 20, in the case where an anneal temperature is higher than 450° C., the resistivity after the anneal process increases. The Ti post-Oxidization is performed below at the temperature which does not increase the resistivity. Thus, the reaction of the Ti film and the Cu film, and the diffusion of Ti atom to Cu wiring are occurred. For example, although Ti atom of about 1E20 atoms/cm$^3$ diffuse in the Cu film in the case where the anneal temperature is 400° C. or less, a resistance of wiring fail to increase. In the above, various effects are acquired by the reaction of the Ti film and the Cu film by selecting the anneal temperature of the Ti post-oxidization appropriately. It is noted that the above-mentioned anneal temperature shows an example and the anneal temperature of Ti post-oxidization is not limited to the above-mentioned anneal temperature.

It is desirable for the oxygen content of the oxidized portion of the metal film at the interface between the barrier metal film and the lower level wiring film to be low in order to reduce contact resistance. As described above, the barrier metal film is oxidized by the oxidizing species emitted from the inter-level insulating film. An optimization of the temperature at a forming process of the barrier metal film and the condition of pretreatment process such as degassing the inter-level insulating film makes low oxygen content of the oxidized portion of the metal film which is in contact with the lower level wiring film compared to the oxygen content of the oxidized portion of the metal film which is in contact with the inter-level insulating film. As a result, the contact resistance between wiring can be reduced without deterioration of barrier performance of the barrier metal film.

For example, a heat treatment is performed at a temperature of not less than 200° C. nor more than 350° C. under a vacuum condition for a time of not less than 10 second nor more than 600 second as pretreatment process performed before the forming process of the barrier metal film (see FIG. 10). The quantity of the oxidizing species emitted from the inter-level insulating film is controlled by the heat treatment, and the oxygen content of the oxidized portion of the metal film, the portion is formed on a surface of the lower level wiring film during the forming process of the barrier metal film after the pretreatment process, is lower than the oxygen content of the oxidized portion of the metal film which is in contact with the inter-level insulating film. In other words, the oxygen content of the oxidized portion of the second Ti film 30c which is in contact with the first wiring layer 40 is lower than the oxygen content of the oxidized portion of the second Ti film 30c which is in contact with the inter-level insulating film 50 in the case of the semiconductor device illustrated in FIG. 12.

Figure 21:
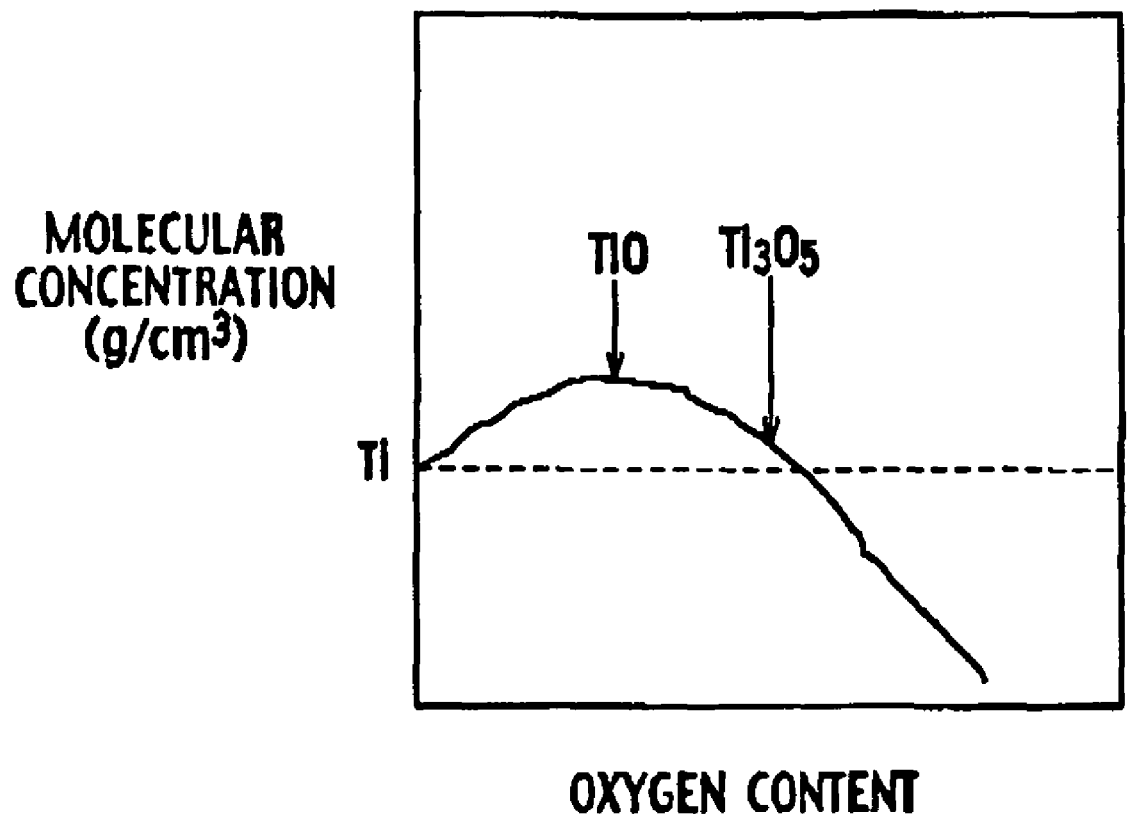
FIG. 21 is a graph illustrating the molecular concentrations of the Ti film and the TiOx film.

FIG. 21 illustrates the molecular concentrations of the Ti film and the TiOx film. As illustrated in FIG. 21, the molecule concentration of the TiOx film is larger than the molecule concentration of the Ti film in the case where the oxygen content in the TiOx film is small compared to the oxygen content in the Ti$_3$O$_5$ film. In other words, the barrier performance of a TiOx film in which the atomic ratio of oxygen to Ti is 5/3 or less is better than the barrier performance of Ti film. Thus, it is desirable for the atomic ratio of oxygen to Ti in the oxidized portion of the second Ti film 30c to be 5/3 or less.

In the description of the semiconductor device manufacturing method according to the first embodiment, it has been described that the second Cu seed film 71 is formed by any one of PVD, CVD, and ALD. It is also possible to partially or entirely fill the via holes 203 and the second wiring trenches 202 by CVD or ALD after the second Cu seed film 71 is formed by PVD. Further, after the formation of the second Ti film 30c, the formation of the second Cu seed film 71 may be performed by CVD or ALD, or a filling process may be directly performed. Needless to say, a filling process can be directly performed by plating after the formation of the second Ti film 30c.

In the semiconductor device manufacturing method according to the first embodiment, the molecular concentration of the barrier metal is changed in the film thickness direction by introducing oxygen into the Ti film mainly composing the barrier metal film. In such case, generally, a stress gradient may be generated to cause film delamination. However, in the semiconductor device manufacturing method according to the first embodiment of the present invention, the temperatures of a degassing process and a Ti formation process are adjusted in order to make a situation of a Ti film in which the closer to an insulating film a portion of a Ti film is, the lower the molecular concentration of a portion of a Ti film becomes, and the closer to a Cu side a portion of a Ti film is, the higher the molecular concentration of a portion of a Ti film becomes. Accordingly, the stress gradient is reduced, thus eliminating the problem that the barrier metal is delaminated from the insulating film or the Cu.

Second Embodiment

A semiconductor device manufacturing method according to a second embodiment of the present invention is a method in which a metal film having characteristics that allow oxygen to be dissolved therein to form a solid solution is oxidized by means other than gas emitted from an insulating film. Hereinafter, an example of the semiconductor device manufacturing method according to the second embodiment will be described. The description will be given by taking an example as a case where the second Ti film 30c is formed as a metal film 30 on the inter-level insulating film 50 illustrated in FIG. 8.

(a) As in a process described in the first embodiment, the substrate 10 is degassed under a vacuum or a reducing atmosphere such as H$_2$ gas at a temperature of, for example, not less than 250° C. nor more than 300° C. As a result, carbon-based residues and the like remaining in the inter-level insulating film 50 are removed. At the same time, reduction treatment is performed on oxide films on the surface of the first wiring layer 40 which are exposed at bottom portions of the via holes 203.

(b) The substrate 10 is transported under a continuous vacuum condition to the inside of an ionized-sputtering chamber, for example, as illustrated in FIG. 13, which is used to form a barrier metal film on the substrate 10. Then, the substrate 10 is transported to the top of a susceptor set at a temperature of, at most, not more than the heating temperature of the process of degassing the inter-level insulating film 50, preferably not more than room temperature. The temperature of the substrate 10 is maintained at a temperature equivalent to the temperature of the susceptor. As illustrated in FIG. 9, the second Ti film 30c is formed by ionized sputtering.

(c) Argon (Ar) gas, nitrogen (N$_2$) gas, and any of O$_2$ gas and H$_2$O are introduced into the ionized-sputtering chamber illustrated in FIG. 13 so that the pressure in the ionized-sputtering chamber becomes a pressure higher than the degree of vacuum at which the second Ti film 30c has been formed, e.g., higher than 0.5×10$^{-5}$ Pa. For example, the pressure in the ionized-sputtering chamber is set to $1\times10^{-5}$ Pa to be maintained for 60 seconds, and then gas is exhausted from the ionized-sputtering chamber. As a result, Ti oxide is formed on the surface of the second Ti film 30c. The substrate 10 is cooled to a temperature equivalent to a temperature at which the second Ti film 30c has been formed, and the second Ti film 30c is additionally deposited so as to have a desired film thickness. In the process of additionally depositing the second Ti film 30c, the pressure in the ionized-sputtering chamber is preferably set to be equivalent to the pressure at which the second Ti film 30c has been formed before the formation of Ti oxide. In the case where the pressure at which the second Ti film 30c is oxidized is equivalent to atmospheric pressure, the oxidation state of the second Ti film 30c cannot be controlled. Accordingly, in the case where the substrate 10 is exposed to air and returned to the ionized-sputtering chamber again, a state cannot be realized in which oxygen is dissolved in the second Ti film 30c to form a solid solution.

As described above, in the semiconductor device manufacturing method according to the second embodiment, the surface of the second Ti film 30c is thermally oxidized during the formation of the second Ti film 30c. Accordingly, Ti oxide is formed to have a higher molecular concentration, and the second Ti film 30c is prevented from being entirely oxidized by oxidizing species such as $H_2O$ emitted from the inter-level insulating film 50. As a result, a pure Ti film having good adhesion to a Cu film is left as the second Ti film 30c in the vicinity of the interface with the Cu film. Further, Ti oxidation in the vicinity of the interface between the second Ti film 30c and the inter-level insulating film 50 is promoted by performing the process of Ti post-oxidation described in the first embodiment. As a result, Ti oxide is formed in the second Ti film 30c, and oxidizing species are prevented from being diffused from the inter-level insulating film 50 into the Cu film. In other words, the function of the barrier metal film as a layer adhering to the Cu film is more effectively ensured. Other processes are substantially the same as processes of the first embodiment and will not be further described.

It has been previously described that in the semiconductor device manufacturing method according to the second embodiment, Ti oxide having a high atomic concentration is formed by oxidizing the surface of the second Ti film 30c having a high atomic concentration during the formation of the second Ti film 30c. However, as illustrated in FIG. 18, it is also effective to form dissimilar metal, such as the Ta film 36, in which the solid solubility of oxygen is low, after the formation of the second Ti film 30c and to use the dissimilar metal as a layer adhering to a Cu film. When the Ta film 36 is formed, a TiOx film having a high atomic concentration, which is under the Ta film 36, prevents $H_2O$ and the like from being diffused, whereby the Ta film 36 is prevented from being oxidized. Thus, an interconnection reliability is improved compared to an interconnection reliability for the case where the Ta film 36 is used singly. The metal film formed on the second Ti film 30c is selected from among the metal films which are hard to be oxidized or metal films with the sufficient adhesion of the oxide thereof and the Cu film, such as Ru, Pd, Pt and Au.

Third Embodiment

A semiconductor device manufacturing method according to a third embodiment of the present invention includes the processes of: emitting, at a first substrate temperature, gas adsorbed in an insulating film having recessed portions such as trenches and via holes formed in a surface thereof and adsorbed on the surface thereof; forming a metal film at a second substrate temperature lower than the first substrate temperature; forming a wiring metal film on the metal film in a configuration such that at least part of the recessed portions are not filled; and oxidizing at least part of the metal film with oxidizing species remaining in the insulating film by heating to a third substrate temperature higher than the second substrate temperature and, at the same time, forming a reaction layer at the interface between the metal film and the wiring metal layer. An example of the semiconductor device manufacturing method according to the third embodiment of the present invention will be described below.

(a) For example, as illustrated in FIG. 8, the second wiring trenches 202 and the via holes 203 are formed. Then, heat treatment is performed under a vacuum condition or a reducing atmosphere such as $H_2$ gas at a temperature of, for example, not less than 250° C. nor more than 300° C. The heat treatment removes part of $H_2O$ and the like contained in the inter-level insulating film 50. If the heat treatment is performed in a reducing atmosphere, reduction treatment is performed on oxide films on the surface of the first wiring layer 40 which are exposed at bottom portions of the via holes 203.

(b) A Ti film is formed as a barrier metal film on the surface of the substrate 10 with good step coverage using ionized sputtering or ALD under a continuous vacuum condition. The substrate temperature is set to be, at most, not more than the heating temperature of the process of degassing the inter-level insulating film 50.

(c) A Cu film is formed as a wiring metal film on the Ti film under a continuous vacuum condition. The Cu film is formed by ionized sputtering or CVD method. The Cu film is formed so that at least part of the second wiring trenches 202 and the via holes 203 are not filled with the second Cu seed film 71 as illustrated in the film formation examples of FIGS. 22A to 22C.

(d) By heating the substrate 10 to a temperature in a range of, for example, 250° C. to 380° C., the second Ti film 30c in contact with the inter-level insulating film 50 is oxidized by oxidizing species such as $H_2O$ remaining in the inter-level insulating film 50, and a compound of Ti and Cu is formed at the interface between the second Cu seed film 71 and the second Ti film 30c. The heating process may be performed after the formation of the second Cu seed film 71 under a continuous vacuum condition or may be performed after exposure to air. The heating temperature of the substrate 10 is preferably set to be equivalent to the heating temperature for removing part of $H_2O$ and the like contained in the inter-level insulating film 50 or the heating temperature of a later process.

(e) By use of a Cu filling method such as plating using the second Cu seed film 71, the second wiring trenches 202 and the via holes 203 which have not yet been filled with a Cu film are fully filled as illustrated in FIG. 11. The second Cu plated film 72, the second Cu seed film 71 and the second Ti film 30c are removed by CMP, thus completing two-layer wiring.

Figure 23A:
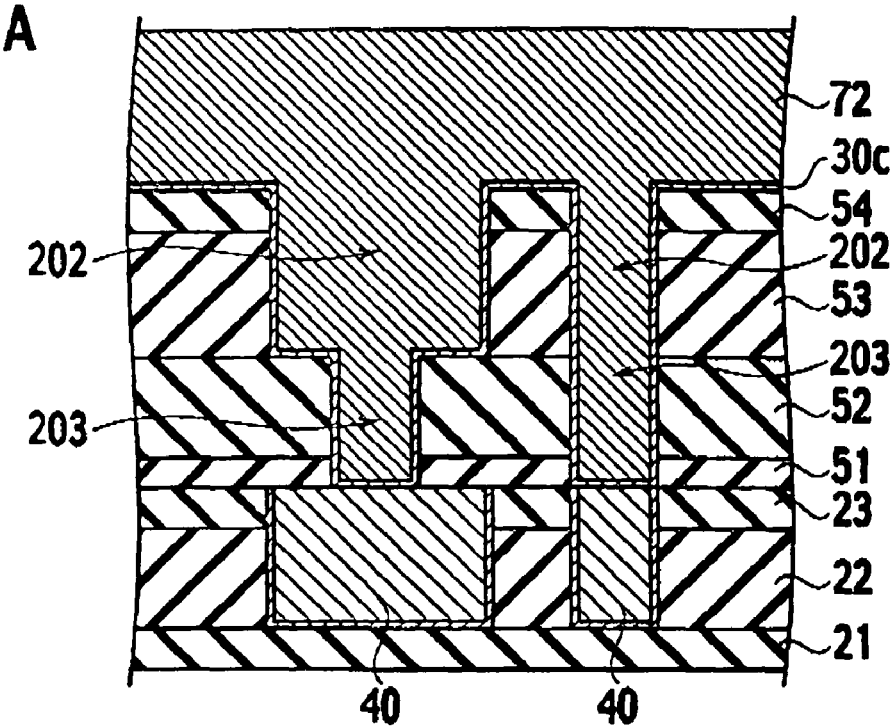
FIGS. 23A and 23B are cross-sectional views illustrating the structure of a wiring layer formed by a semiconductor device manufacturing method according to a comparative example of the third embodiment of the present invention.
Figure 23B:
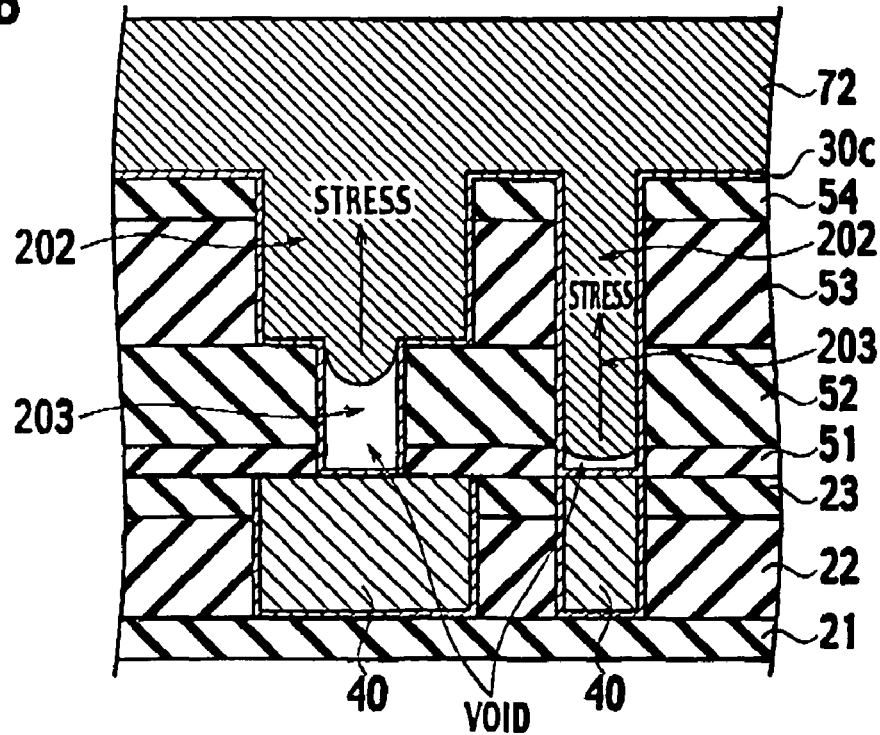

Generally, in the case where a Cu plated film is formed on a Cu seed film, heat treatment is often performed in order to increase the Cu crystal particle size. However, if adhesion between a barrier metal film and the Cu film is low, the Cu film in the via holes 203 are drawn up after the heating process as illustrated in FIG. 23B, whereby voids occur. This is because the volume of the Cu film formed in the second wiring trenches 202 on the via holes 203 is large and therefore stress which pulls the Cu film in the via holes 203 occurs. FIG. 23A illustrates an example in which no voids occur in the via holes 203.

Figure 24A:
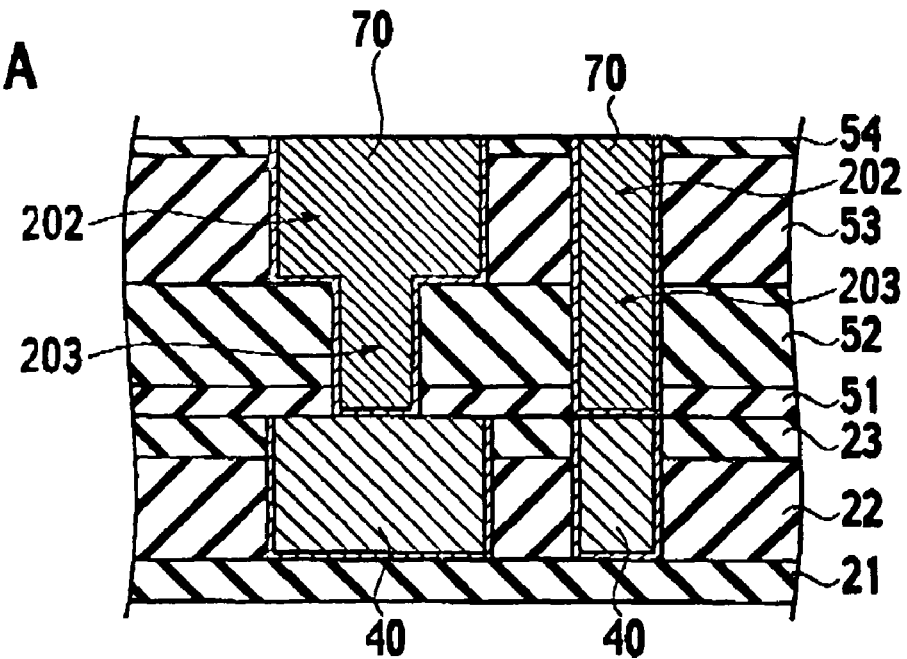
FIGS. 24A and 24B are cross-sectional views illustrating the structure of a wiring layer formed by a semiconductor device manufacturing method according to a comparative example of the third embodiment of the present invention.
Figure 24B:
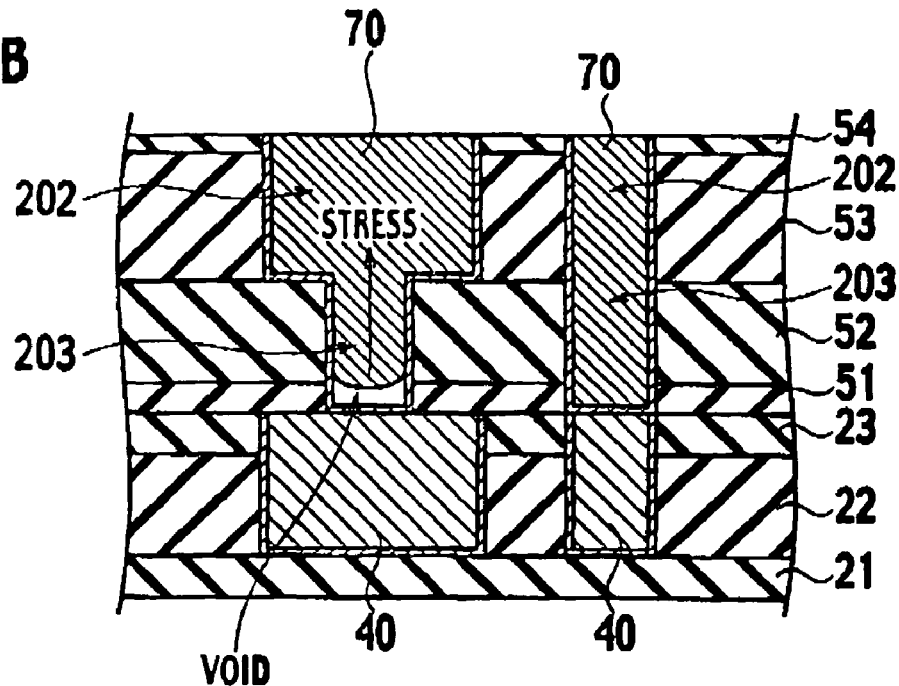

As illustrated in FIG. 24B, in the case where the Cu film and the barrier metal film are removed by CMP to form a wiring shape, heating for the formation of an inter-level insulating film or heating in a sintering process also causes the occurrence of voids in the via holes 203 connected to a wide interconnection. FIG. 24A illustrates an example in which no voids occur in the via holes 203.

However, in the semiconductor device manufacturing method according to the third embodiment of the present invention, the substrate 10 is heated in a thin film configuration such as a Cu seed before plating and filling, and voids due to stress do not occur. Even in the case of FIG. 22C in which the via holes 203 are filled with a Cu film, stress which pulls the Cu film in the via holes 203 is small because the volume of the Cu film filling the insides of the wiring trenches 202 on the via holes 203 is small. Accordingly, a reaction between the Ti film as a barrier metal film and the Cu film occurs during heat treatment, whereby a Ti—Cu compound layer is formed at the interface between the Ti film and the Cu film. The Ti—Cu compound layer serves as a layer adhering to the Ti film and the Cu film. Thus, strong adhesive strength is obtained, and no voids are formed even in a later heating process in which the Ti—Cu compound layer is subjected to stress. Since an oxide film having a high atomic concentration is formed at the interface between the insulating film and the Ti film simultaneously with the formation of the compound layer, oxidizing species can be prevented from being further emitted from the insulating film, and the Ti film is prevented from being further oxidized. As described in the first embodiment, an oxide film having a high molecular concentration is formed at the interface between the Ti film and the insulating film simultaneously with heating in a thin film configuration such as a Cu seed. Accordingly, it is a matter of course that a failure of a semiconductor device due to the diffusion of oxidizing species in a later heating process can be prevented from occurring.

Figure 25A:
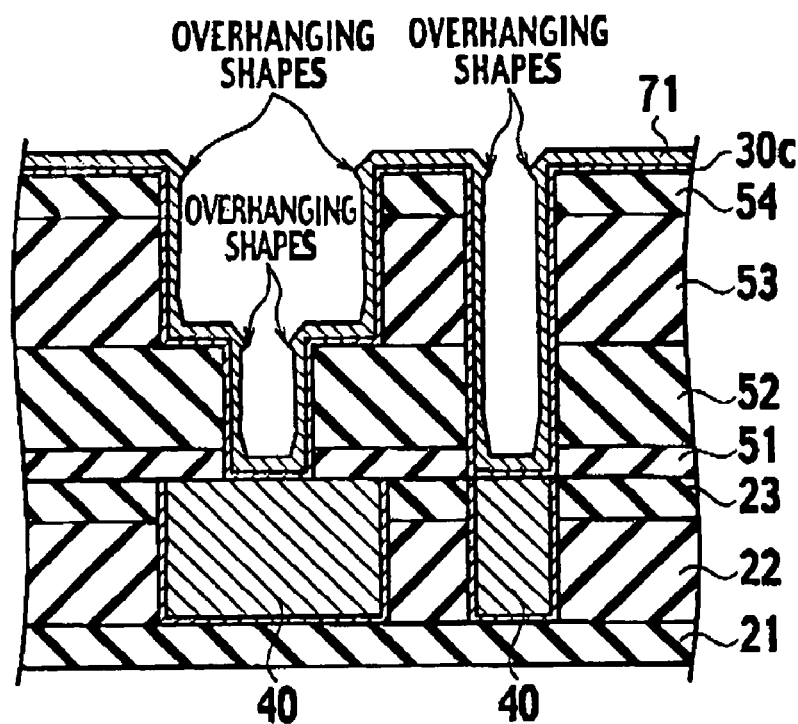
FIGS. 25A and 25B are cross-sectional views illustrating the structure of a wiring layer formed by the semiconductor device manufacturing method according to the third embodiment of the present invention.
Figure 25B:
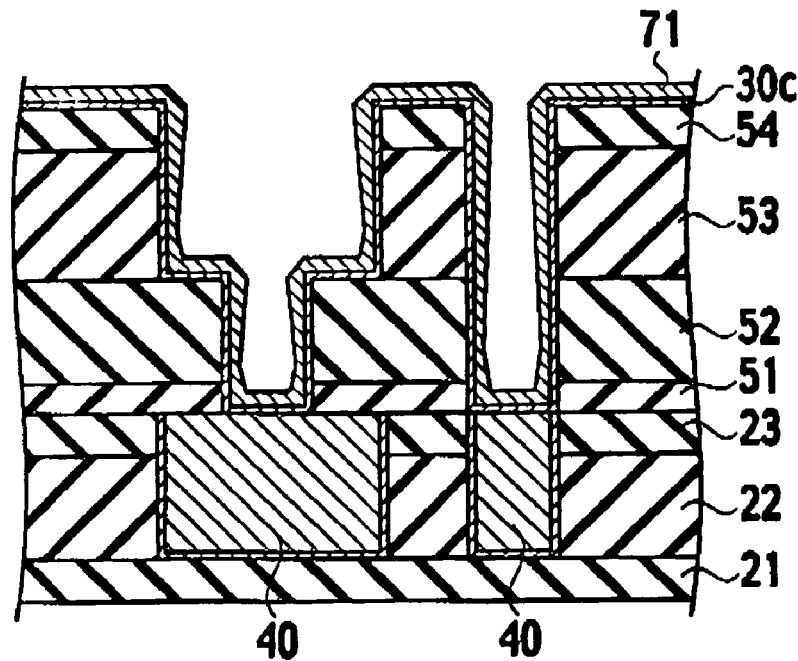

In the formation of the second Cu seed film 71 by use of ionized sputtering, it is desirable that sputtering conditions be adjusted so that the second Cu seed film 71 has a conformal shape. However, as illustrated in FIG. 25A, protrusions having overhanging shapes occur in opening portions of the via holes 203 and opening portions of the second wiring trenches 202 depending on sputtering conditions. The overhanging-shaped protrusions inhibit the entry of a plating solution in a later plating process and obstruct the opening portions of the second wiring trenches 202 and the via holes 203, whereby voids are left in interconnections and the via holes. However, if heat treatment is performed after the formation of the second Cu seed film 71 as in the semiconductor device manufacturing method according to the third embodiment of the present invention, the second Cu seed film 71 diffuses along the surface thereof so that the surface area becomes small, in order to have a stable shape by reducing the surface energy. In other words, as illustrated in FIG. 25B, the overhanging-shaped protrusions are planarized to have shapes closer to conformal shapes. In particular, if heat treatment is performed under a continuous vacuum condition after the formation of the second Cu seed film 71, the above-described effect is large. Accordingly, with the semiconductor device manufacturing method according to the third embodiment of the present invention, the entry of a plating solution into the second wiring trenches 202 and the via holes 203 is not inhibited, and voids are prevented from occurring.

In the case where trenches and via holes are filled with a Cu film by use of plating, a large amount of oxidizing species such as $O_2$ and $H_2O$ are contained in the Cu film formed by plating. On the other hand, a Cu seed film formed by ionized sputtering or CVD is formed in an oxidizing ambient at reduced pressure in which the amount of residual impurities is small, and a less amount of oxidizing species are contained in the Cu seed film. However, if a Cu film is formed on a Cu seed film containing a less amount of oxidizing species by plating, there are cases where oxidizing species in the Cu film formed by plating pass through the thin seed Cu film in a heating process after the plating process to oxidize the barrier metal film. As described previously, the adhesion of the oxidized barrier metal film to the Cu film becomes low, and reliability is lowered. In this case, if the thickness of the second Cu seed film 71 on the side walls of the via holes 203 are increased by use of CVD as illustrated in FIG. 22B, or if the entire via holes 203 are filled with the second Cu seed film 71 by use of CVD as illustrated in FIG. 22C, the influence of oxidizing species from the second Cu plated film 72 filling the via holes 203 can be reduced. In other words, the second Ti film 30c in the via holes 203 can be prevented from being oxidized. The above-described effect is large particularly in the case where the via holes 203 is fully filled with the second Cu seed film 71 by use of CVD (FIG. 22C). Accordingly, with the semiconductor device manufacturing method according to the third embodiment, adhesion between the Cu film and the barrier metal film in the via holes 203 is not lowered, and no voids occur in the via holes 203 even if stress which pulls the Cu film in the via holes 203 occurs in a later heating process.

Fourth Embodiment

A semiconductor device manufacturing method according to a fourth embodiment of the present invention includes the processes of: emitting, at a first substrate temperature, gas of oxidizing species adsorbed in an insulating film having recessed portions such as trenches and via holes formed in a surface thereof and adsorbed on the surface thereof; supplying source gas to be adsorbed to the surfaces of the recessed portions at a second substrate temperature lower than the first substrate temperature; exhausting residual source gas which has not been adsorbed to the surfaces of the recessed portions, then irradiating light to the surfaces of the recessed portions to decompose molecules of the source gas adsorbed to the surfaces of the recessed portions, and forming a metal film made of metal atoms contained in the molecules of the source gas on the surfaces of the recessed portions.

Figure 26A:
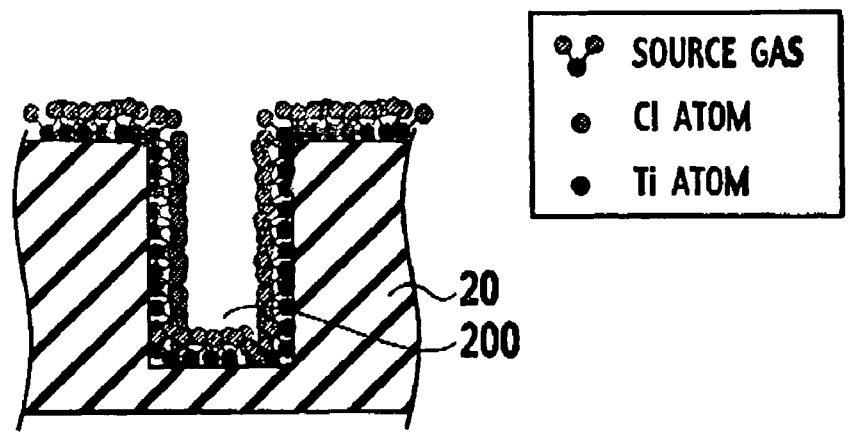
FIGS. 26A and 26B are schematic diagrams for explaining a semiconductor device manufacturing method according to a fourth embodiment of the present invention.
Figure 26B:
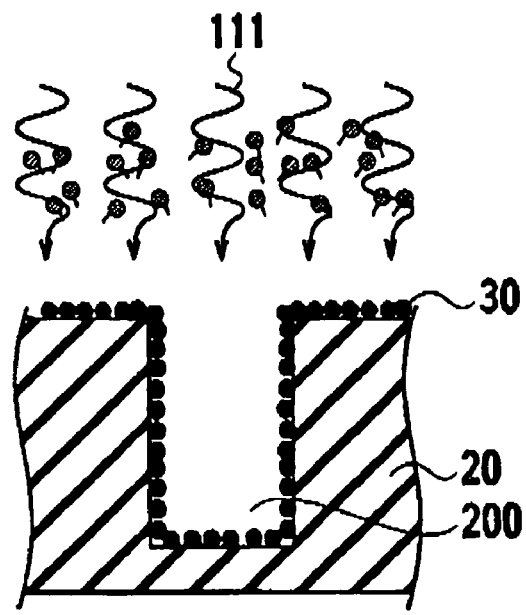

For example, titanium tetrachloride ($TiCl_4$) gas is introduced as source gas with the pressure and flow rate thereof adjusted into a chamber for performing the process of forming a thin film, and $TiCl_4$ molecules are uniformly adsorbed on the surface of the insulating film 20 as illustrated in FIG. 26A. In the case where, a low-dielectric constant insulating film is employed as the insulating film 20, many vacancies are contained in the insulating film 20 in order to reduce the dielectric constant. Oxidizing species such as water absorbed at the time of exposure to air and oxygen remain in the insulating film 20. Accordingly, in the case where the insulating film 20 is heated in order to decompose $TiCl_4$ molecules adsorbed to the surface of the insulating film 20, oxidizing species are emitted from the side surfaces and the like of a recessed portion 200. As a result, a Ti film as the metal film 30 formed by decomposing $TiCl_4$ molecules bonds to oxidizing species emitted from the insulating film 20, whereby characteristics of the Ti film are deteriorated. Thus, the process of emitting oxidizing species in the insulating film 20 is performed before the formation of the metal film 30. In the process of forming the metal film 30, the temperature of the insulating film 20 needs to be maintained lower than the temperature of the process of emitting oxidizing species. With a method that the decomposition of adsorbed molecules is promoted by the light energy of light 111, as illustrated in FIG. 26B, the temperature of the insulating film 20 can be maintained low.

Figure 27:
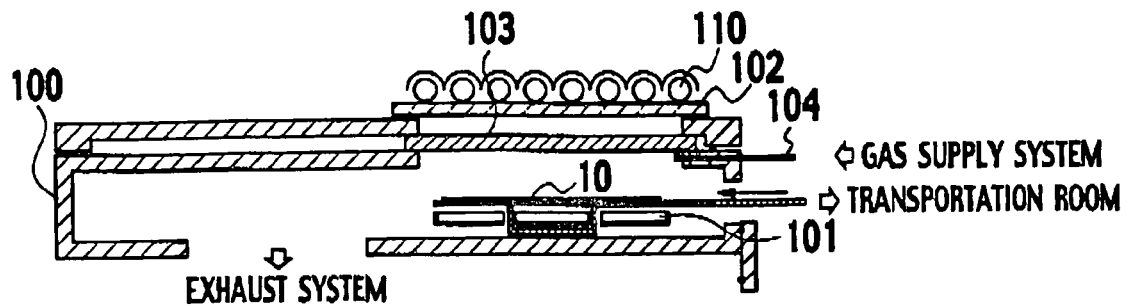
FIGS. 27 to 30 illustrate a process flowchart for explaining the semiconductor device manufacturing method according to the fourth embodiment of the present invention.

FIG. 27 illustrates the configuration of semiconductor manufacturing apparatus usable for the semiconductor device manufacturing method according to the fourth embodiment of the present invention. The semiconductor manufacturing apparatus illustrated in FIG. 27 includes a chamber 100 and a light source 110 and is connected to a gas supply system and an exhaust system (not shown). The chamber 100 includes a susceptor 101 on which the substrate 10 is placed, a light transmission window 102, an openable and closable shield plate 103 for shielding the light transmission window 102, and a gas introduction portion for introducing gas into the chamber 100. The light 111 which has been emitted from the light source 110 and passed through the light transmission window 102 is irradiated to the substrate 10. Further, as needed, the shield plate 103 blocks the light 111. The chamber 100 is connected to a transportation room (not shown) including a substrate transport mechanism. Thus, treatment can be performed on the substrate 10 in another chamber connected to the transportation room under a continuous vacuum condition before or after a film formation process in the chamber 100.

An example of a semiconductor device manufacturing method using the semiconductor manufacturing apparatus illustrated in FIG. 27 will be described below using FIGS. 27 to 30. Needless to say, the following semiconductor device manufacturing method is a single example and the present invention can be realized by various semiconductor device manufacturing methods other than and including the modified example. Hereinafter, a description will be given of a semiconductor device manufacturing method in which a Ti film is formed as the metal film 30 on the surface of the insulating film 20.

(a) Heating to a temperature of approximately 250° C. to 300° C. is performed in a chamber (not shown) connected to the transportation room, thus performing the degassing of gas adsorbed on the insulating film 20. If Cu interconnections placed in a layer under the insulating film 20 are exposed at bottom portions of via holes, $H_2$ reduction treatment can be simultaneously performed on the surfaces of the Cu interconnections by introducing $H_2$ and performing degassing. Alternatively, $H_2$ reduction treatment can be performed on the surfaces of the Cu interconnections before or after degassing.

(b) As illustrated in FIG. 27, the substrate 10 is transported from the transportation room to the top of the susceptor 101 under a continuous vacuum condition. The temperature of the substrate 10 is set, at most, lower than that of the substrate 10 during degassing. For example, the temperature of the substrate 10 is set at 150 to 200° C.

Figure 28:
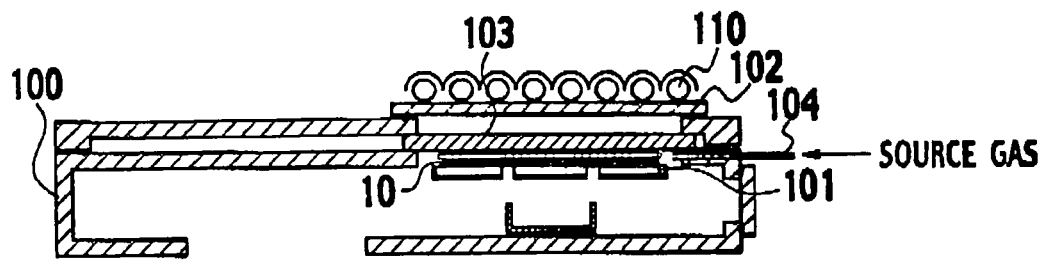

(c) As illustrated in FIG. 28, $TiCl_4$ gas as source gas for a Ti film is introduced from the gas supply system through the gas introduction portion 104 in a state with the shield plate 103 closed. The boiling point of $TiCl_4$ is 136.4° C. A layer of $TiCl_4$ molecules does not condense on the substrate 10 but is adsorbed on the surface of the insulating film 20 if the temperature of the substrate 10 is set to be not less than the boiling point of $TiCl_4$. Since $TiCl_4$ is liquid at room temperature, $TiCl_4$ is vaporized in a vaporizer (not shown) and introduced into the chamber 100 using carrier gas such as Ar gas, $N_2$ gas, helium (He) gas, or $H_2$ gas.

Figure 29:
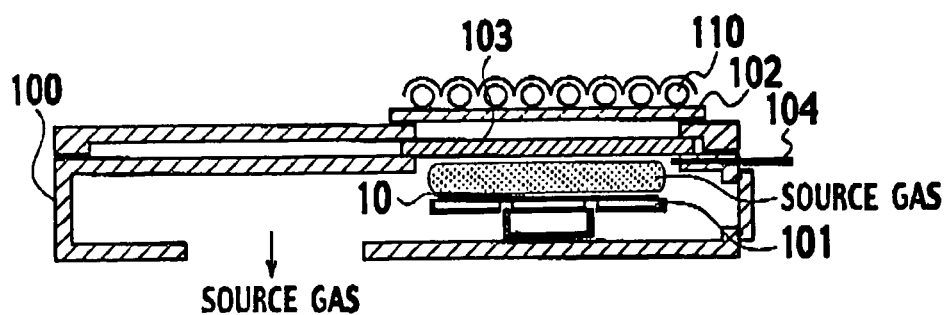

(d) After $TiCl_4$ gas is introduced into the chamber 100 for a predetermined time, the introduction of $TiCl_4$ gas is stopped in a state with the shield plate 103 closed as illustrated in FIG. 29. Then, $TiCl_4$ gas remaining in the chamber 100 is exhausted.

Figure 30:
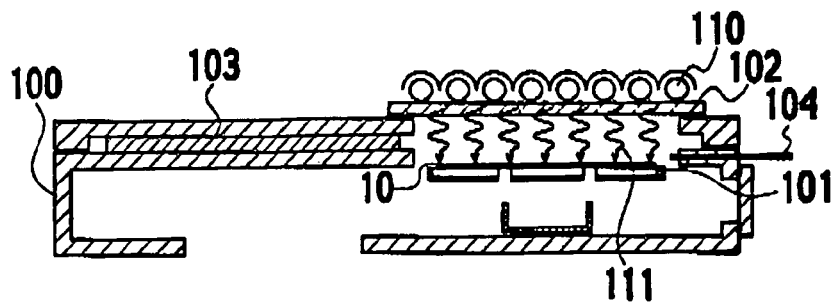

(e) As illustrated in FIG. 30, the shield plate 103 is opened, and the light 111 from the light source 110 passes through the light transmission window 102 and is irradiated to the substrate 10. The energy of the light 111 decomposes $TiCl_4$ molecules adsorbed on the surface of the insulating film 20, whereby a thin film layer of Ti is formed on the insulating film 20. At this stage, reactive gas such as $H_2$ gas may be introduced. In the case where $H_2$ gas is introduced as reactive gas, $H_2$ gas irradiated with the light 111 dissociates into active hydrogen radicals (H*), and the decomposition of $TiCl_4$ molecules is further promoted.

By described above, a layer of Ti atoms is formed on the surface of the insulating film 20. Then, a Ti film having a desired film thickness is formed by repeating the above-described processes. As the low-dielectric constant insulating film 20, a PAE film, a SiCO film, or the like can be employed.

Moreover, for example, in the case where a mechanism for changing the position of the susceptor 101 in the chamber 100 in the vertical direction is provided, the height of the susceptor 101 may be adjusted to a low position so that exhaust efficiency becomes high in the process of exhausting residual components of source gas. Further, though an example in which source gas is introduced through a single gas introduction portion 104 is illustrated in FIGS. 27 to 30, a plurality of gas introduction portions 104 may be provided in order to improve the uniformity of source gas in the chamber 100. Source gas may be introduced into the inside of the shield plate 103 through the gas introduction portion 104 to be introduced into the chamber 100 through a plurality of holes provided in a portion of the shield plate 103 which faces the substrate 10. As a result, the adsorption of source gas molecules is made uniform over the surface of the insulating film 20, and the uniformity of the thickness of a formed film is improved.

The wavelength of the light 111 is selected depending on the light absorbency of source gas molecules. For example, in the case where an excimer lamp is used, the wavelength of the light 111 is selected depending on the type of gas used in the excimer lamp. Excimer lamps which can be employed include single-wavelength excimer lamps such as an Ar excimer lamp having a wavelength of 126 nm, a krypton (Kr) excimer lamp having a wavelength of 146 nm, a xenon (Xe) excimer lamp having a wavelength of 172 nm, a krypton chloride (Krcl) excimer lamp having a wavelength of 222 nm, and a xenon chloride (XeCl) excimer lamp having a wavelength of 308 nm. In the case where a mercury lamp is used, light having a plurality of wavelengths including 185 nm and 254 nm can be selected. The irradiation energy of the light 111 and irradiation time are adjusted depending on the aspect ratios of via holes and wiring trenches formed on the substrate 10.

The standard enthalpy of formation of $TiCl_4$ molecules used in the above description is expressed by the following equations (1) and (2):

$$TiCl_4 \text{ (gas)} \rightarrow Ti \text{ (solid)} + 2Cl_2 \text{ (gas)} \quad (1)$$

$$\text{standard enthalpy of formation } dHf° = 763 \text{ kJ/mol} \quad (2)$$

From equations (1) and (2), the standard enthalpy of formation per $TiCl_4$ molecule is $1.27 \times 10^{-15}$ J. Since a $TiCl_4$ molecule has four Ti—Cl bonds, the bond dissociation energy of single Ti—Cl bond is $3.17 \times 10^{-16}$ J. The wavelength of light for obtaining the bond dissociation energy of a Ti—Cl bond is not more than 627 nm. Further, the light absorption wavelength of a $TiCl_4$ molecule has local maxima at 280 nm and 232 nm. Accordingly, if light having a wavelength not more than 627 nm and near the local maximum absorption wavelengths of a TiCl$_4$ molecule is used as the light 111, TiCl$_4$ molecules can be efficiently decomposed. In the case where a source of the light 111 is selected from excimer lamps, it is possible to select a Xe excimer lamp (wavelength: 172 nm), a KrCl excimer lamp (wavelength: 222 nm), or a XeCl excimer lamp (wavelength: 308 nm). Alternatively, a mercury lamp having wavelengths of 185 nm and 254 nm can be used as a source of the light 111. Instead of a narrow-waveband light source, a wide-waveband light source may be used. A recent low-dielectric constant insulating film is formed by curing (sintering, polymerizing, or condensing) precursors by heating, electron beam irradiation, UV light irradiation, or the like. If such a low-dielectric constant insulating film is further irradiated with UV light, internal bonds which should maintain bonding are broken, and there are cases where the dielectric constant is increased. In such cases, a wavelength which does not influence an insulating film used is selected depending on characteristics of the insulating film. In particular, cure by UV light irradiation, generally called UV cure, dissociates only specific and required bonds because the energy of the cure is limited to a certain region. In such case, even if UV light irradiation is performed for a long time, unnecessary decomposition does not occur, and characteristics of the low-dielectric constant insulating film do not change. Accordingly, if the wavelength of light used in the fourth embodiment is matched with the wavelength of UV cure of the low-dielectric constant insulating film, the insulating film is not damaged.

Figure 31:
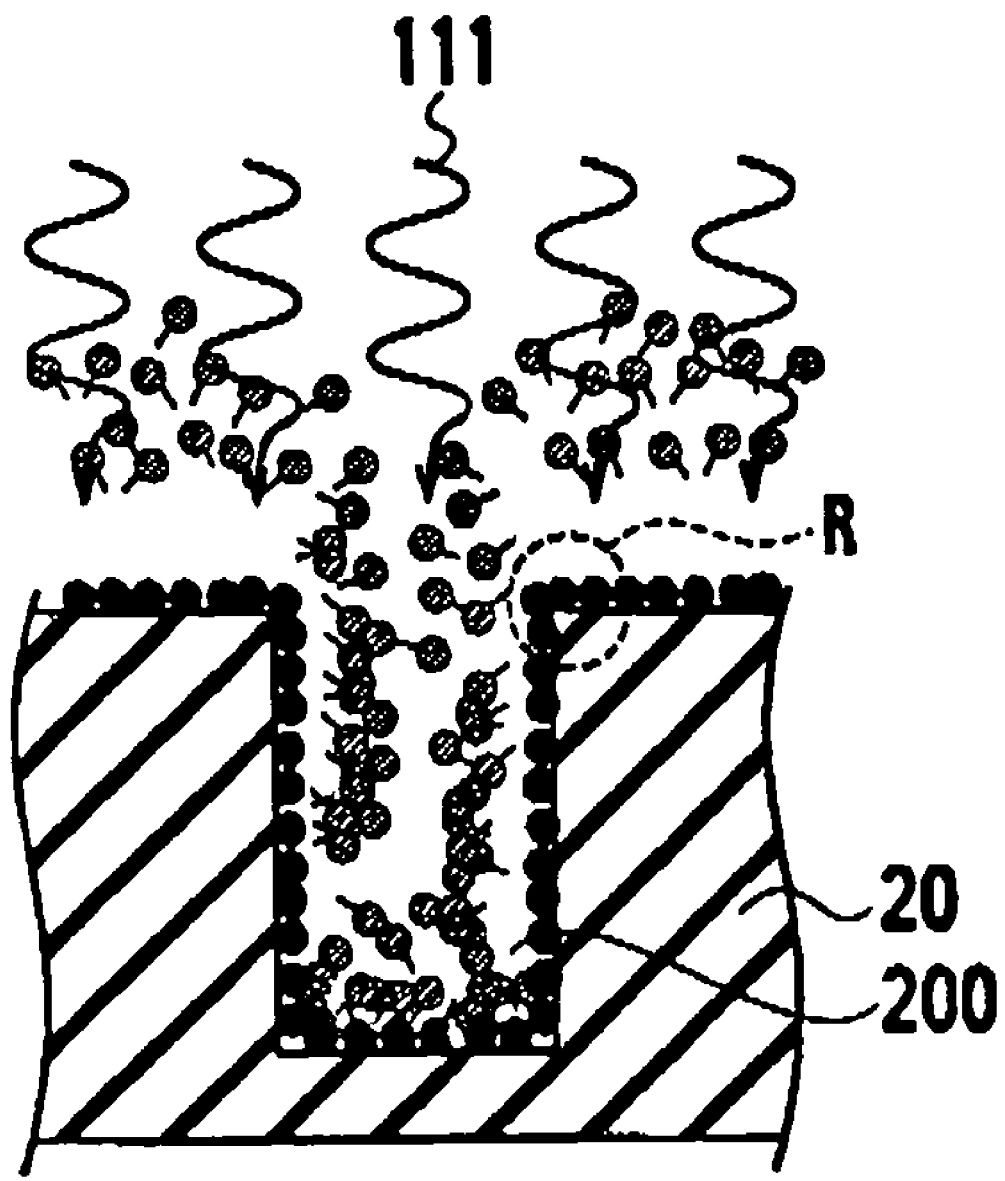
FIG. 31 is a schematic diagram for explaining an effect of the semiconductor device manufacturing method according to the fourth embodiment of the present invention.

A bottom portion of the recessed portion 200, illustrated in FIG. 26A, is more difficult to irradiate to the light 111 than other surfaces of the insulating film 20. Accordingly, the speed of decomposition of TiCl$_4$ molecules is low at the bottom portion of the recessed portion 200. Thus, there are cases where the decomposition of TiCl$_4$ molecules does not sufficiently proceed at the bottom portion of the recessed portion 200 even after time has elapsed which is necessary to decompose TiCl$_4$ molecules on the surface of the insulating film 20 using the light 111. Accordingly, the intensity of the light 111 and irradiation time are adjusted so that decomposition is completed at the bottom portion of the recessed portion 200. As illustrated in FIG. 26B, Ti atoms are uniformly adsorbed on the surface of the insulating film 20. FIG. 31 illustrates an example in which irradiation time is set to time necessary to decompose TiCl$_4$ molecules in region R of the recessed portion 200 which is near the surface of the insulating film 20. As illustrated in FIG. 31, the decomposition of TiCl$_4$ molecules does not sufficiently proceed at the bottom portion of the recessed portion 200 even after TiCl$_4$ molecules in region R and on the surface of the insulating film 20 have been decomposed.

Figure 32A:
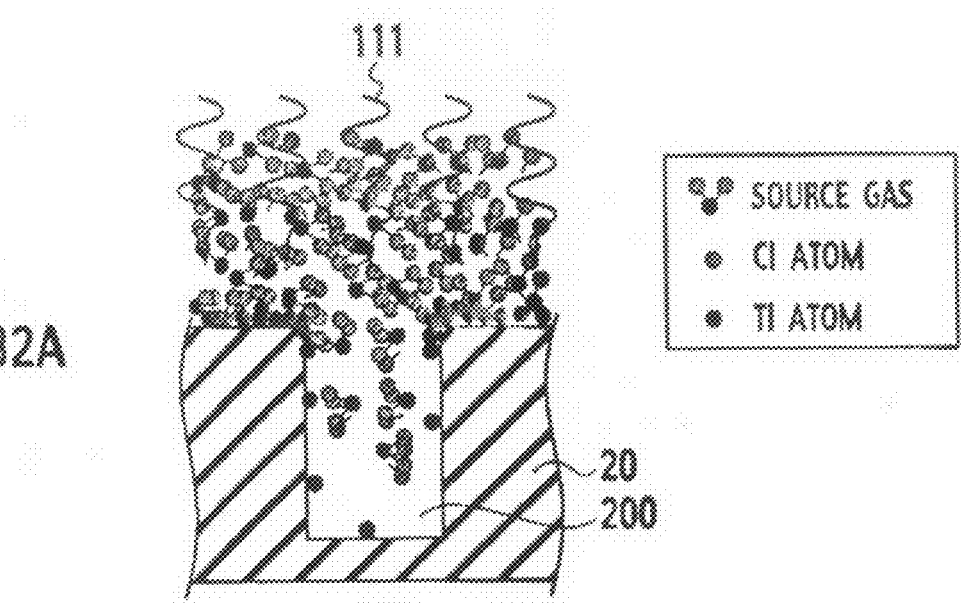
FIGS. 32A to 32C are schematic diagrams for explaining a semiconductor device manufacturing method of related art.
Figure 32B:
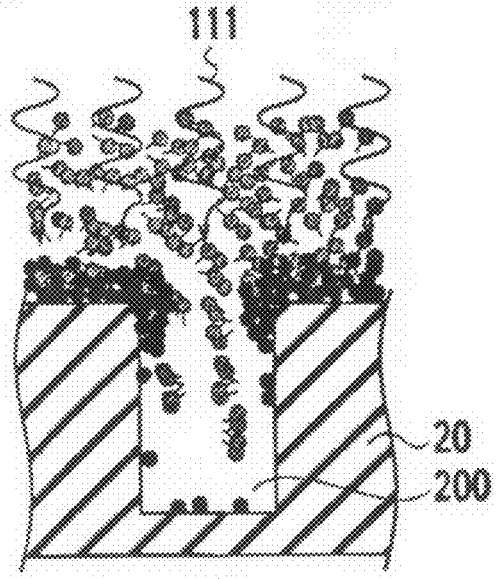
Figure 32C:
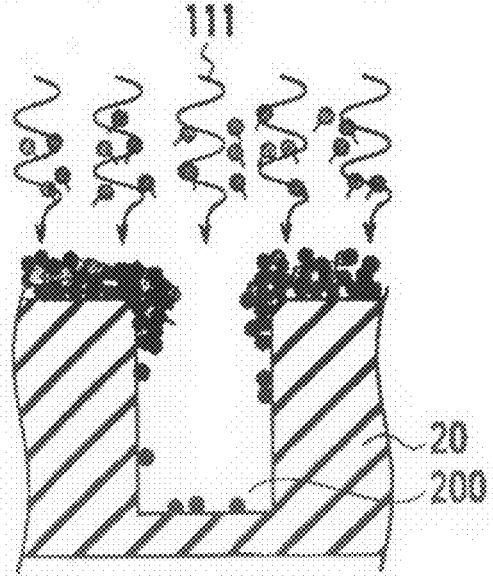

FIGS. 32A to 32C illustrate an example in which a Ti film is formed by photo CVD. In photo CVD, the light 111 is irradiated to the recessed portion 200 while source gas TiCl$_4$ is being introduced. As illustrated in FIG. 32A, in photo CVD, the speed of decomposition of TiCl$_4$ molecules at the opening portion of the recessed portion 200 is high, and the speed of decomposition of TiCl$_4$ molecules at the bottom portion thereof is low. Accordingly, a Ti film is thickly formed at the opening portion of the recessed portion 200 at first. This makes it difficult for source gas TiCl$_4$ to enter the bottom portion. Consequently, as illustrated in FIGS. 32B and 32C, a Ti film has poor step coverage, and a film which contains a large amount of Cl atoms as impurities is formed at the opening portion of the recessed portion 200. Further, since the light 111 is irradiated while source gas is introduced, a Ti film and the like adhere to the chamber 100—side surface of the light transmission window 102 which allows the light 111 to pass therethrough, whereby the intensity of the light 111 is gradually decreased.

In the semiconductor device manufacturing method according to the fourth embodiment of the present invention, as described using FIGS. 27 to 30, a Ti film is formed in units of atomic layers by use of ALD. Accordingly, it is possible to solve a shortage of step coverage due to the difference in the speed of decomposition of source gas between the opening portion and bottom portion of the recessed portion 200, which shortage is a problem in photo CVD. Thus, an extremely conformal Ti film can be formed. As described using FIGS. 27 to 30, the irradiation of the light 111 and the introduction of source gas are performed in separate processes. Accordingly, when TiCl$_4$ gas is introduced, the light transmission window 102 is covered with the shield plate 103, and therefore no Ti film adheres to the light transmission window.

As described above, in a method in which the decomposition of adsorbed molecules is promoted by the light energy of the light 111, the temperature of the substrate 10 can be maintained low. In order to form a Ti film as a barrier metal film on the highly-hygroscopic low-dielectric constant insulating film 20, it is important to form the Ti film by setting the temperature, of the substrate 10 lower than the temperature of the substrate 10 at the time of degassing as described in the explanation of FIG. 27. The reason is as follows: in the case where the Ti film is formed by setting the temperature of the substrate 10 higher than the temperature of degassing, the Ti film is formed while oxidizing species adsorbed in the insulating film 20 and not emitted in the degassing process are being emitted; as a result, there occurs influences such as the oxidation of the Ti film as described later. In order to reduce the emission of oxidizing species from the insulating film 20 during the formation of the Ti film, it is effective to lower the temperature for the formation of the Ti film and, before the Ti film is formed, perform heat treatment in which the temperature of the substrate 10 is raised to a temperature not less than the substrate temperature in the process of forming the Ti film. By the heat treatment, oxidizing species emitted from the insulating film 20 during the formation of the Ti film are removed from the insulating film 20. Even in the case where oxidizing species contained in the insulating film 20 cannot be completely removed, the amount of oxidizing species emitted during the formation of the Ti film is reduced.

Figure 33A:
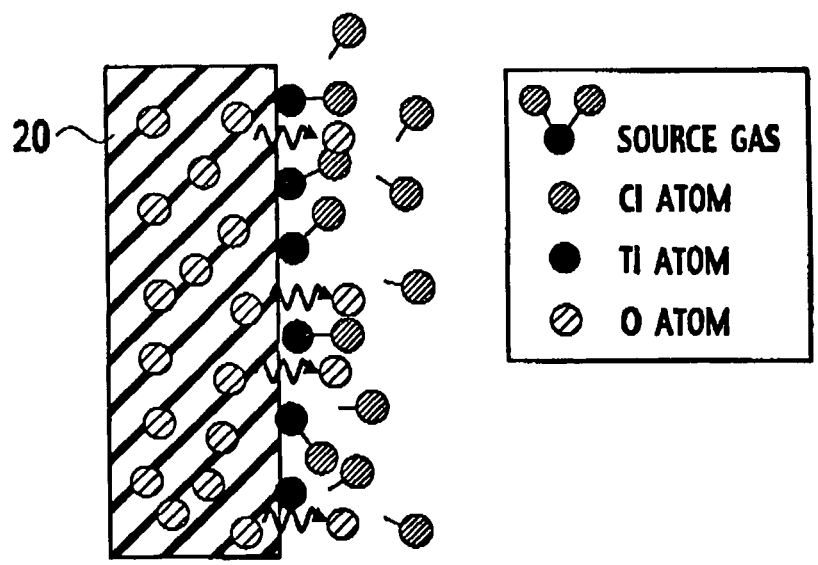
FIGS. 33A to 33C are cross-sectional views illustrating the structure of an oxide film formed by related art.
Figure 33B:
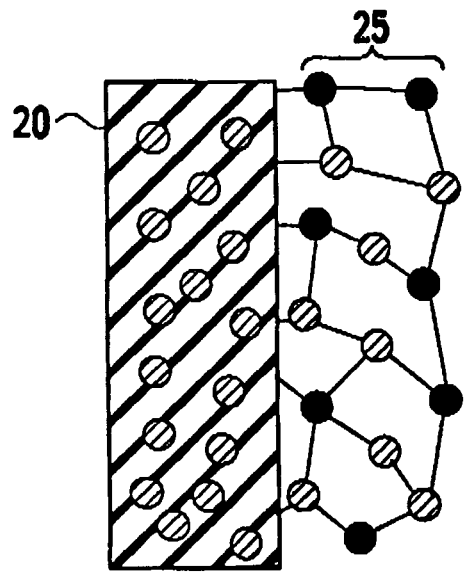
Figure 33C:
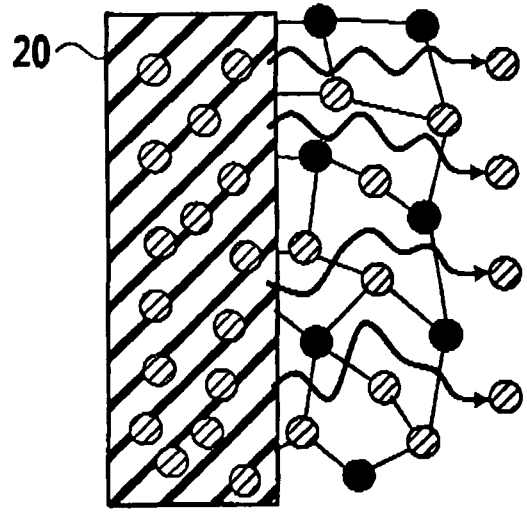

The oxidation of Ti at the time of forming the Ti film using the fourth embodiment will be described using FIGS. 33A to 33C. As illustrated in FIG. 33A, when oxidizing species are emitted in the process of decomposing TiCl$_4$ molecules, Ti atoms bond to oxygen (O) to form titanium oxide (TiOx) 25 (FIG. 33B). In other words, a TiOx film 25 having a low molecular concentration is formed by a mechanism similar to the mechanism described using FIGS. 14A to 14C. As illustrated in FIG. 33C, oxidizing species pass through the TiOx film to reach a Cu film, and the Cu film is oxidized, whereby the SM resistances of Cu interconnections are deteriorated.

Figure 34A:
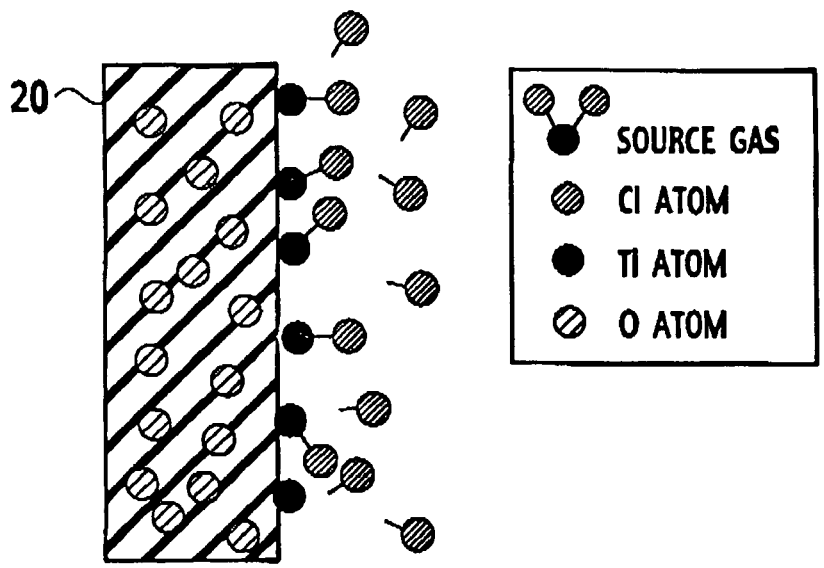
FIGS. 34A to 34C are cross-sectional views illustrating the structure of an oxide film formed by the semiconductor device manufacturing method according to the fourth embodiment of the present invention.
Figure 34B:
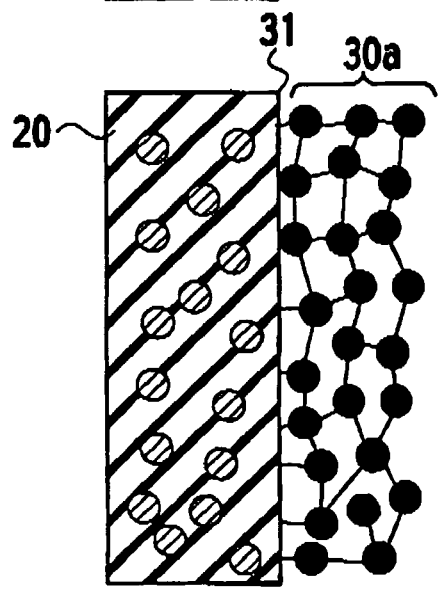
Figure 34C:
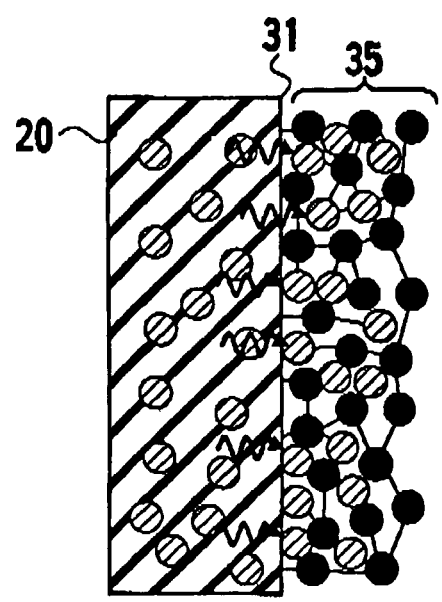

In the case where a Ti film is formed at a temperature lower than that of the degassing process, a pure Ti film 30a is formed as a barrier metal film as illustrated in FIG. 34B. In other words, a TiOx film 35 having a high molecular concentration is formed (FIG. 34C) in an insulating film formation process or a sintering process after the formation of the Ti film 30a by a mechanism similar to the mechanism described using FIGS. 15A to 15C. Accordingly, the SM resistances of Cu interconnections are not deteriorated.

As described above, an inorganic insulating film such as SiCO or an organic insulating film such as PAE can be employed as the low-dielectric constant insulating film. As a stopper material in an etching process, a SiCN film, a silicon nitride (SiN) film, or the like can be employed. The amount of source gas adsorbed differs depending on the type of the insulating film. This is because terminal groups of atoms on the outermost surface differ depending on the type of the insulating film. There occurs a difference in adsorption characteristics: for example, the surface of the insulating film is hydrophobic in the case where the surface is terminated with $CH_3$ groups, or hydrophilic in the case where the surface is terminated with OH groups. Accordingly, in a dual damascene structure in which a plurality of types of insulating films are stacked to form single inter-level insulating film, film thickness variations occur in a barrier metal film formed on the insulating films of different types. In such case, it is effective to improve the quality of the surface of the insulating films by performing light irradiation beforehand. For example, if $CH_3$ groups are dissociated by specific light energy, terminal groups become OH groups. As a result, the adsorption state of source gas becomes uniform even in the case where a metal film is formed on the surface of the insulating films of a plurality of types. The introduction of source gas after the establishment of a state in which adsorption easily occurs reduces film thickness variations in the metal film depending on the types of the insulating films.

There are cases where residues of a resist film and by-products secondarily generated in an etching process remain on the substrate 10 when the recessed portion 200 is formed in the inter-level insulating film, and hamper conduction at the bottom portion of the recessed portion 200. Such residues contain carbon (C) or fluorine (F). Accordingly, the process of removing residues by irradiating light while allowing decomposing gas such as $O_2$, $H_2$, $H_2O$, or ammonia ($NH_3$) to flow may be employed. Further, resist may be removed by irradiating light while decomposing gas, such as $O_2$, $H_2$, $H_2O$, or $NH_3$, is introduced.

An example in which a Ti film is formed has been described in the above explanation. In the case where a titanium nitride (TiN) film is intended to be formed, reactive gas such as $N_2$ gas or $NH_3$ gas is introduced in the process of FIG. 30. In the case where $NH_3$ gas is introduced, $NH_3$ gas irradiated with light dissociates into active hydronitrogen radicals (NH*) to decompose $TiCl_4$ molecules and nitride Ti. Thus, a TiN film can be formed. Alternatively, a TiN film is formed using source gas such as tetrakis-dimethyl-amino-titanium (TDMAT, $Ti[N(CH_3)_2]_4$)) or tetrakis-ethylmethylamido-titanium (TEMAT, $Ti[N(C_2H_5CH_3)_2]_4$)). Further, an example using $TiCl_4$, which is an inorganic compound, as source gas has been described in the fourth embodiment. However, source gas of titanium tetrabromide ($TiBr_4$), titanium tetraiodide ($TiI_4$), or an organic compound may be used.

Although an example in which a Ti film is formed as a barrier metal film has been described in the above explanation, a Cu film which serves as a seed of a plated film to be formed on the Ti film may be formed using a similar film formation method. In the case where the Cu film is formed, organometallic gas such as a Copper trimethylvinylsilane (Cu(hfac)TMVS), is used as source gas. In this case, a chamber for the formation of the Ti film and that for the formation of the Cu film may be different. Alternatively, the Ti film and the Cu film may be formed in the same chamber by switching source gas. Further, alter a Cu film of several atomic layers is formed by the semiconductor device manufacturing method according to the fourth embodiment of the present invention, a Cu film can also be further formed by known CVD. In the case where a Cu film is formed on dissimilar metal by CVD, a seed for Cu growth is necessary for the surface of the dissimilar metal. If the concentration of this seed is low, a uniform Cu film cannot be formed. If a Cu film of several atomic layers is formed beforehand on Ti by use of the semiconductor device manufacturing method according to the fourth embodiment of the present invention, a uniform Cu film can be grown even by use of CVD at a high deposition rate. Furthermore, since bonding between the Ti film and the Cu film is promoted by early light irradiation, adhesion at the Ti/Cu interface is excellent.

Fifth Embodiment

A semiconductor device manufacturing method according to a fifth embodiment of the present invention is a method for forming an aluminum oxide ($Al_2O_3$) film, which is a high-dielectric film used for a capacitor or the like of a memory element. A method will be described below in which an $Al_2O_3$ film is formed on a substrate using the semiconductor manufacturing apparatus illustrated in FIG. 24. Hereinafter, a description will be given of the case where trimethylaluminum (TMA, ($Al(CH_3)_3$)) is used as source gas.

(a) As in the method described using FIGS. 27 to 30, an aluminum (Al) film is formed on a surface of the substrate 10. In other words, the substrate 10 is transported from the transportation room to the top of the susceptor 101. Next, the shield plate 103 of the light transmission window 102 is closed, and TMA gas is introduced into the chamber 100. TMA is liquid at room temperature and therefore vaporized to be introduced into the chamber 100 using carrier gas such as Ar gas, N gas, He gas, or H gas. Then, the temperature of the substrate 10 is adjusted to such a temperature that TMA gas does not condense, thus causing TMA molecules to be adsorbed on the substrate 10. Subsequently, the introduction of the source gas is stopped to exhaust TMA gas in the chamber 100. Then, the shield plate 103 is opened to irradiate the substrate 10 with the light 111, whereby a thin Al film is formed on the surface of the substrate 10.

Figure 35:
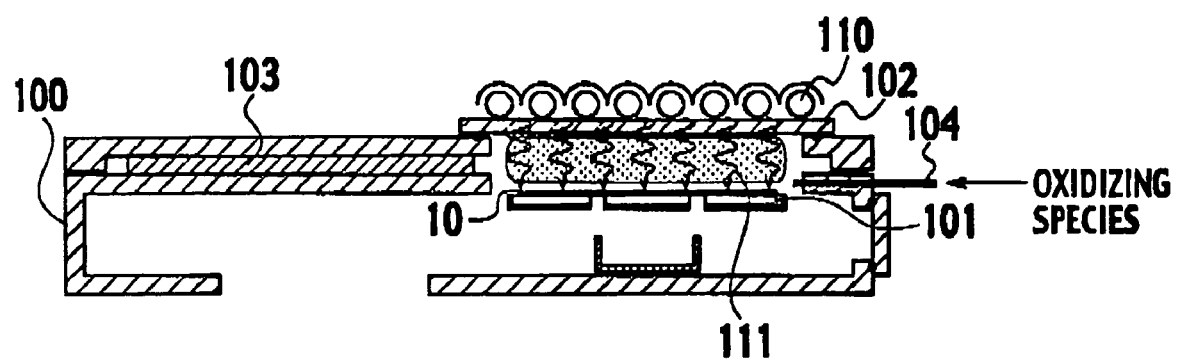
FIG. 35 is a process flowchart for explaining a semiconductor device manufacturing method according to a fifth embodiment of the present invention.

(b) As illustrated in FIG. 35, an oxidizing species such as $O_2$ or $H_2O$ is introduced into the chamber 100 to oxidize the Al film formed on the substrate 10, thus forming an $Al_2O_3$ film. Alternatively, after an Al film having a desired thickness is formed by repeating the processes described using FIGS. 27 to 30 a plurality of times, the Al film oxidation process illustrated in FIG. 35 is performed. In the oxidation process, the Al film may be oxidized by introducing an oxidizing species, or an oxidizing species may be dissociated into oxygen radicals by light irradiation to improve oxidation efficiency by the oxygen radicals. The Al film oxidation process may be performed after the substrate 10 is transported to another chamber. Alternatively, the substrate 10 may be exposed to air to perform the oxidation process by use of other equipment.

Figure 36A:
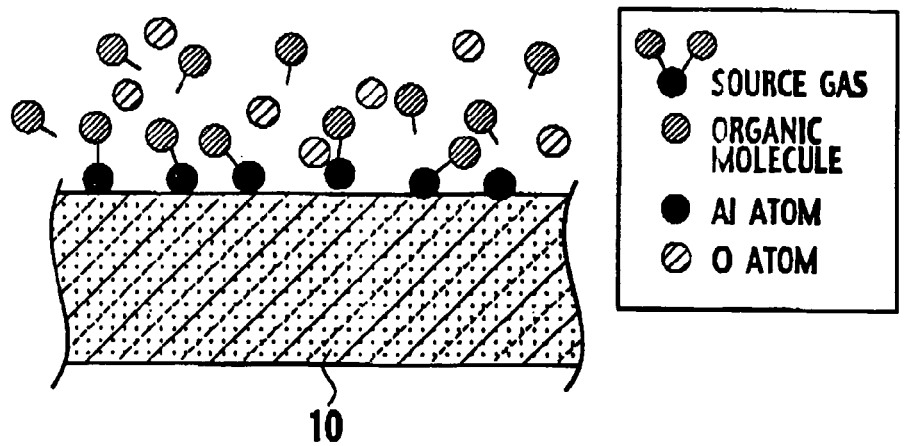
FIGS. 36A to 36C are cross-sectional views illustrating the structure of an Al oxide film formed by related art.
Figure 36B:
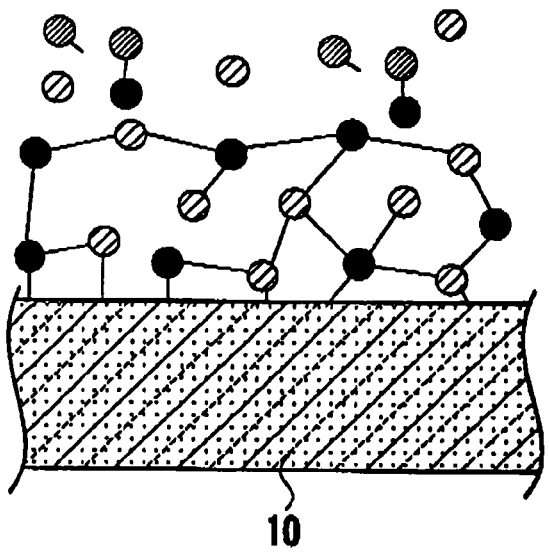
Figure 36C:
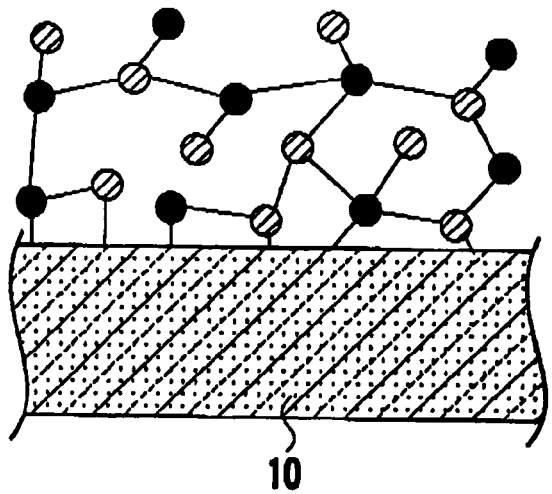

It is known that a high-concentration $Al_2O_3$ film is formed on the surface of the Al film by oxidation caused by heating after the formation of the Al film. However, Al is low-melting metal. Accordingly, when it is attempted to form a very thin Al film, the Al film is agglomerated on the substrate even at a relatively low temperature to be divided into island-shaped portions, and it is difficult to form a continuous thin Al film. Thus, it has been difficult to form an $Al_2O_3$ film having a high atomic concentration by oxidation after an extremely thin Al film is formed by a film formation method, such as CVD or ALD, in which substrate heating is required for the decomposition of source gas. Accordingly, being studied are ALD in which adsorbed gas is decomposed while an oxidizing species is being allowed to flow and ALD in which an $Al_2O_3$ film is formed using source gas containing oxygen. However, since Al atoms bond to oxygen in a state (unbound state) in which the Al atoms do not bond to each other in a decomposition process, the Al—O interatomic distance is large as illustrated in FIGS. 36A and 36B. Accordingly, an $Al_2O_3$ film having a low molecular concentration is formed as illustrated in FIG. 36C. The $Al_2O_3$ film having a low molecular concentration contains many dangling bonds and has problems such as large leakage current. "Dangling bonds" are uncombined bonds occupied by electrons not involved in bonding.

Figure 37A:
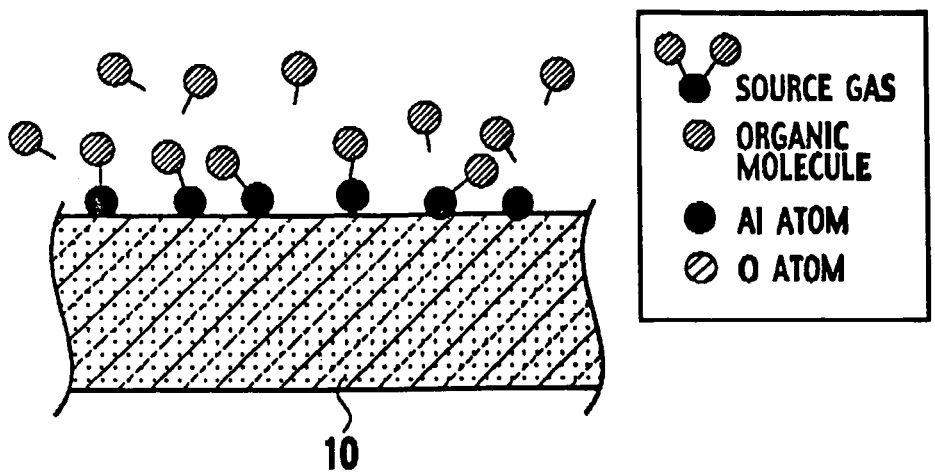
FIGS. 37A to 37C are cross-sectional views illustrating the structure of an Al oxide film formed using the semiconductor device manufacturing method according to the fifth embodiment of the present invention.
Figure 37B:
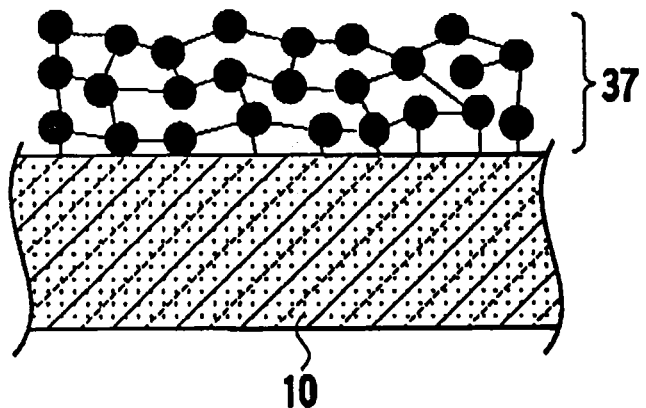
Figure 37C:
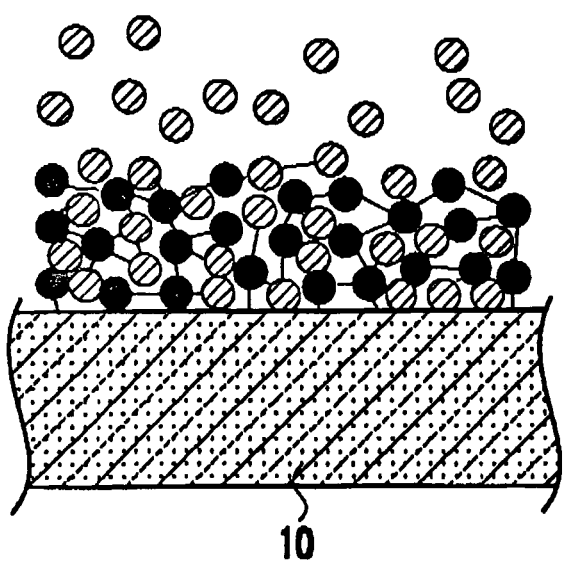

On the other hand, in the semiconductor device manufacturing method according to the fifth embodiment of the present invention, adsorbed molecules are decomposed by light energy as illustrated in FIGS. 37A and 37B. Accordingly, the substrate 10 does not need to be heated to high temperature, and an Al atomic layer can be formed while the agglomeration of an Al film 37 is being prevented. Further, after the Al film 37 is formed, the Al film 37 is oxidized while being subjected to self stress caused by Al—Al bonds of the Al film 37. Thus, a dense $Al_2O_3$ film having a high molecular concentration is formed as illustrated in FIG. 37C.

In order to further reduce leakage current, impurities such as hafnium (Hf) are added to the $Al_2O_3$ film. In this case, gas containing hafnium may be introduced with source gas.

Although an example using TMA has been described in the above, explanation, it is possible to use source gas such as dimethylaluminum hydride (DMAH, $(Al(CH_3)_2H)$) or dimethylethylamine alane (DMEM, $(AlH_3 \cdot N(CH_3)(CH_5))$). Further, this method can also be applied to the formation of a film of an oxide of metal other than Al. A metal nitride film may be formed by forming a metal film and then nitriding the metal film by introducing a nitriding species. Other processes are substantially the same as those of the first embodiment and will not be further described.

Sixth Embodiment

Figure 38A:
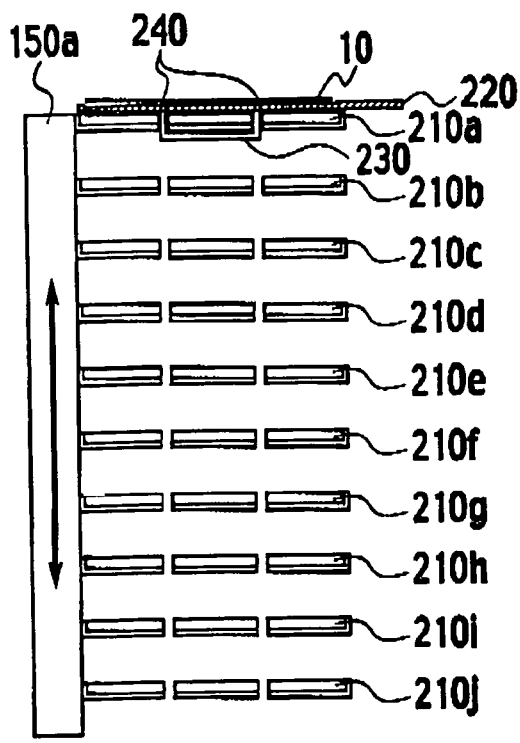
FIG. 38A is a cross-sectional view of semiconductor manufacturing apparatus according to a sixth embodiment of the present invention.
Figure 38B:
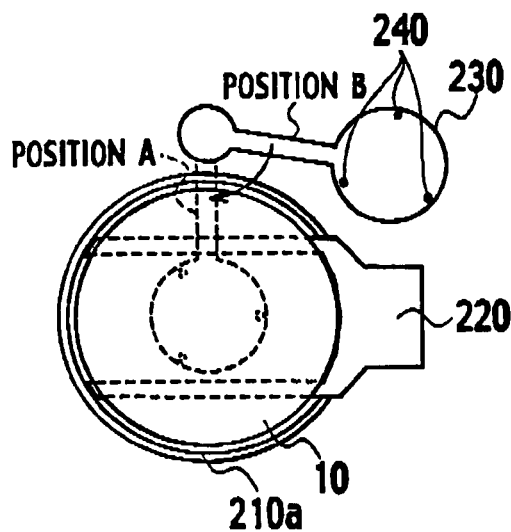
FIG. 38B is a top view of the semiconductor manufacturing apparatus according to the sixth embodiment of the present invention.

Semiconductor manufacturing apparatus according to a sixth embodiment of the present invention is illustrated in FIGS. 38A and 38B. The semiconductor manufacturing apparatus illustrated in FIGS. 38A and 38B can be applied to the semiconductor device manufacturing methods described in the first to fourth embodiments.

As described above, a low-dielectric constant insulating film contains many vacancies and is highly hygroscopic. Accordingly, oxidizing species such as $H_2O$ contained in the low-dielectric constant insulating film are emitted by heating for the formation of a metal film. In order to reduce the influence of emitted gas on the metal film and the like, degassing is performed before the formation of the metal film. However, with the reduction of the dielectric constant of the insulating film, the amount of emitted gas tends to increase, and heating time for degassing is becoming longer. If heating temperature in degassing is raised, heating time can be reduced. However, if a substrate is heated to high temperature before the formation of a metal film such as a barrier metal film, voids occur in Cu interconnections formed on the substrate. If the insulating film is degassed at low temperature, time necessary for degassing increases and throughput decreases.

As described in the first to fourth embodiments, it is important to control the degassing of the low-dielectric constant insulating film. In order to perform sufficient control, it is necessary to improve throughput or to improve the efficiency of degassing highly as in high-temperature heating.

Hereinafter, an example will be described in which throughput is improved in degassing. The throughput of degassing performed before the formation of a metal film can be improved by the semiconductor manufacturing apparatus illustrated in FIGS. 38A and 38B.

The semiconductor manufacturing apparatus illustrated in FIG. 38A includes a plurality of hot plates 210a to 210j connected thereto, a vertically movable support body 150a, and a rotatable pickup mechanism 230. The pickup mechanism 230 has lift pins 204 adsorbed thereto. Further, the hot plates 210a to 210j have holes through which the lift pins 204 pass. Substrates 10 can be placed on the hot plates 210a to 210j, respectively. Hereinafter, a method for placing a substrate 10 on the hot plate 210a will be described using FIG. 38B. FIG. 38B is a top view of the hot plate 210a part of the semiconductor manufacturing apparatus.

(a) As illustrated in FIG. 38B, the pickup mechanism 230 moves to position A under the hot plate 210a. The vertical position of the support body 150a is adjusted so that the tips of the lift pins 240 are protruded from the upper surface of the hot plate 210a through the holes provided in the hot plate 210a.

(b) The substrate 10 is transported from the transportation room (not shown) by a transport robot hand 220. The transported substrate 10 is placed on the tips of the lift pins 240.

(c) The support body 150a moves upward, whereby the tips of the lift pins 240 become lower than the upper surface of the hot plate 210a. Thus, the substrate 10 is placed on the hot plate 210a.

(d) The pickup mechanism 230 rotates and moves to position B.

Then, the support body 150a moves upward, other substrates are placed on the hot plates 210b to 210j as in the above-described method. Further, after treatment is completed, the substrates 10 are transported to the transportation roam by performing an operation reverse to that of the above-described method. In the case where there are substrates to be subsequently processed, the substrates are placed on the hot plates 210a to 210j from which substrates have been removed after the completion of treatment. Repeating this makes it possible to avoid an unnecessary increase in the number of hot plates 210a to 210j. FIG. 38A illustrates an example in which the number of hot plates is 10, but needles to say, the number of hot plates is not limited to 10.

The above-described semiconductor manufacturing apparatus illustrated in FIG. 38A can be used as one of a plurality of chambers connected to a cluster tool. Before or after treatment performed by the semiconductor manufacturing apparatus illustrated in FIG. 38A, another treatment can be performed under a continuous vacuum condition in another chamber connected to the transportation room. For example, after oxidizing species contained in an insulating film are reduced by the semiconductor manufacturing apparatus illustrated in FIG. 38A, the substrate is moved to another chamber through the transportation room to remove oxide films on the surfaces of Cu interconnections. A continuous process can be performed in which a barrier metal film is then formed in another chamber and in which a Cu film is further formed in still another chamber.

The semiconductor manufacturing apparatus illustrated in FIG. 38A can improve the throughput of degassing. In the case of a semiconductor device manufacturing method in which long time is required for degassing and in which a process is advanced in units of a plurality of substrates, degassing time becomes very long in semiconductor manufacturing apparatus in which only one substrate can be degassed in one chamber. For example, suppose that 10 minutes are required for the degassing of an insulating film. The processing time of a process (hereinafter referred to as a "second processing process") which is performed in another chamber and which requires the longest processing time next to the degassing process is assumed to be 72 seconds. In this case, the difference in processing time between the degassing process and the second processing process is time for which substrates are waiting in another chamber for the completion of degassing. If time required for transport between chambers is assumed to be 20 seconds, it takes approximately 4 hours and 36 minutes to consecutively degas 25 substrates. If a plurality of substrates are concurrently degassed in one chamber using the semiconductor manufacturing apparatus illustrated in FIGS. 38A and 38B, time required for degassing can be greatly reduced. Further, the footprint of the entire equipment can be reduced compared to that for the case where a plurality of chambers are installed, each of which can process only one substrate.

It is also industrially required to minimize equipment cost by reducing the number of hot plates 210a to 210j included in the semiconductor manufacturing apparatus illustrated in FIG. 38A to a required minimum. For example, the number of hot plates 210a to 210j is set to a number obtained by rounding up, to a whole number, the time required for degassing divided by the processing time of the second processing process. If the calculated number of hot plates are prepared, it is possible to minimize time for which other process is stopped in order to wait for the completion of degassing. In other words, the number of hot plates of the semiconductor manufacturing apparatus illustrated in FIG. 38A is set to an integer obtained by rounding up t1/t2 to a whole number, where t1 is the time for degassing and t2 is the processing time of the second processing process. When a calculation is made in the above-described example, 600 seconds divided by 72 seconds is 8.3. Accordingly, the number of hot plates is nine. In this case, processing time for the case where degassing is performed in units of 25 substrates is approximately one hour and six minutes.

In order to improve degassing efficiency by increasing the rate of temperature rise of the substrates 10 placed on the hot plates 210a to 210j, temperature can be controlled by attaching electrostatic chuck mechanisms to the hot plates 210a to 210j. Further, in order to improve heat conduction, the rate of temperature rise of the substrates 10 and the temperature uniformity thereof may be improved by introducing He gas, $H_2$ gas, Ar gas, $N_2$ gas, or the like into the chamber. Alternatively, the substrates 10 may be heated by irradiation with a halogen lamp.

Moreover, oxide films on the surfaces of Cu interconnections can be reduced and removed by introducing, into the chamber for degassing, reducing gas such as $H_2$ or radical gas obtained by activating reducing gas by a microwave discharge or the like. As a result, a reduction treatment process performed in another chamber is eliminated. It should be noted, however, that a gate valve to the transportation room needs to be opened and closed during long-time degassing because a substrate 10 is transported for each of the hot plates 210a to 210j. In the case where reducing gas is introduced, the introduction of the reducing gas is stopped when the gate valve is opened for substrate transport. The purpose is to avoid a drop in the degree of vacuum in the transportation room caused by reducing gas such as $H_2$ flowing into the transportation room, the contamination of other chambers caused by the entry of reducing gas into the other chambers through the transportation room, and the like. In the case where reducing gas or the like is not introduced, the degree of vacuum in the chamber for degassing also drops due to gas emitted from the substrates, gas introduced for heat conduction, and the like. Accordingly, gas enters other chambers through the transportation room when the gate valve is opened and closed. In this case, the entire cluster tool is controlled so that gate valves to the other chambers are not opened when the gate valve is opened and closed.

Figure 39:
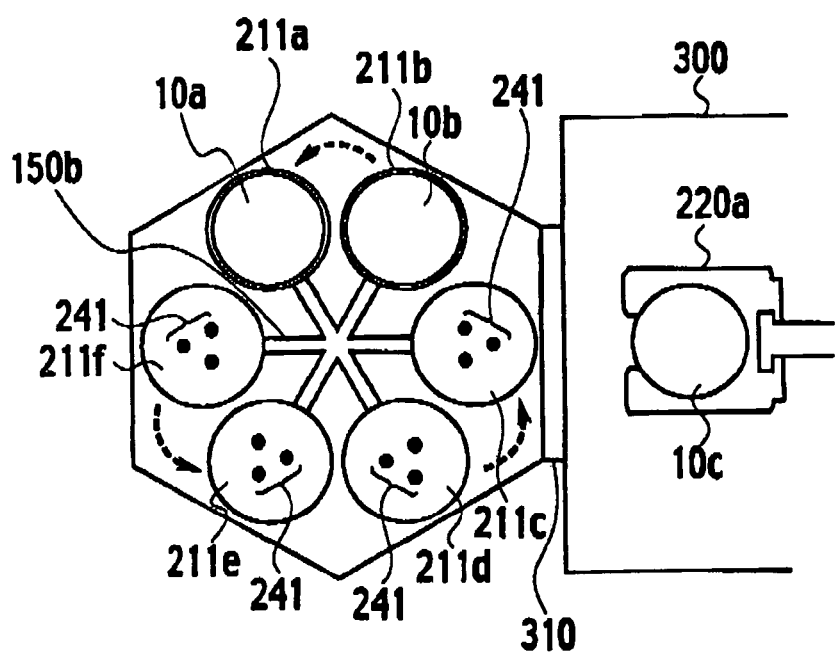
FIG. 39 is a schematic diagram illustrating the structure of semiconductor manufacturing apparatus according to the sixth embodiment of the present invention.

In FIG. 38A, a description has been given of semiconductor manufacturing apparatus in which a plurality of hot plates 210a to 210j are placed to be vertically superposed. Other than this, semiconductor manufacturing apparatus illustrated in FIG. 39 can be applied to the degassing process. The semiconductor manufacturing apparatus illustrated in FIG. 39 has a structure in which a plurality of hot plates 211a to 211f are radially placed on a rotatable support body 150b. The hot plates 211a to 211f have vertically movable lift pins 241. Substrates can be placed on the hot plates 211a to 211f, respectively. FIG. 39 illustrates an example in which substrates 10a and 10b are placed on the hot plates 211a and 211b, respectively. As an example of an operation of the semiconductor manufacturing apparatus illustrated in FIG. 39, the case where a substrate 10c is placed on a hot plate 211 will be described below. The substrate 10c transported by a transport robot hand 220a is placed on the tips of the lift pins 241 protruded from the upper surface of the hot plate 211c. Then, the lift pins 241 are lowered, whereby the substrate 10c is placed on the hot plate 211c.

The support body 150b is rotated, and substrates are sequentially placed on the hot plates 211d to 211f. After treatment is completed, the substrates are taken out by performing an operation reverse to that of the above-described method. In the case where there are substrates to be subsequently processed, the substrates are placed on the hot plates 211a to 211f from which substrates have been removed. Repeating this makes it possible to avoid an unnecessary increase in the number of hot plates 211a to 211f. A structure in which the hot plates 211a to 211f are individually isolated in separate vacuums makes it possible to prevent removed gas emitted during the degassing of each substrate from contaminating the other substrates, and to avoid the contamination of the transportation room by the gas. As illustrated in FIG. 39, an opening-and-closing operation of a slit valve 310 prevents the removed gas from contaminating a transportation room 300. The slit valve 310 opens when substrates are transported from the transportation room 300 to the hot plates 211a to 211f, and closes when the degassing process is being performed.

If the hot plates 211a to 211f are isolated into separate vacuums, when $H_2$ gas or the like is introduced for oxide reduction treatment to be performed on a substrate on one hot plate, substrates on the other hot plates and the transportation room can be prevented from being contaminated by the $H_2$ gas or the like. Similarly to the semiconductor manufacturing apparatus illustrated in FIG. 38A, the semiconductor manufacturing apparatus illustrated in FIG. 39 can be used as one chamber connected to a cluster tool. FIG. 39 illustrates an example in which the number of hot plates is 6, but needless to say the number of hot plates is not limited to 6.

Figure 40A:
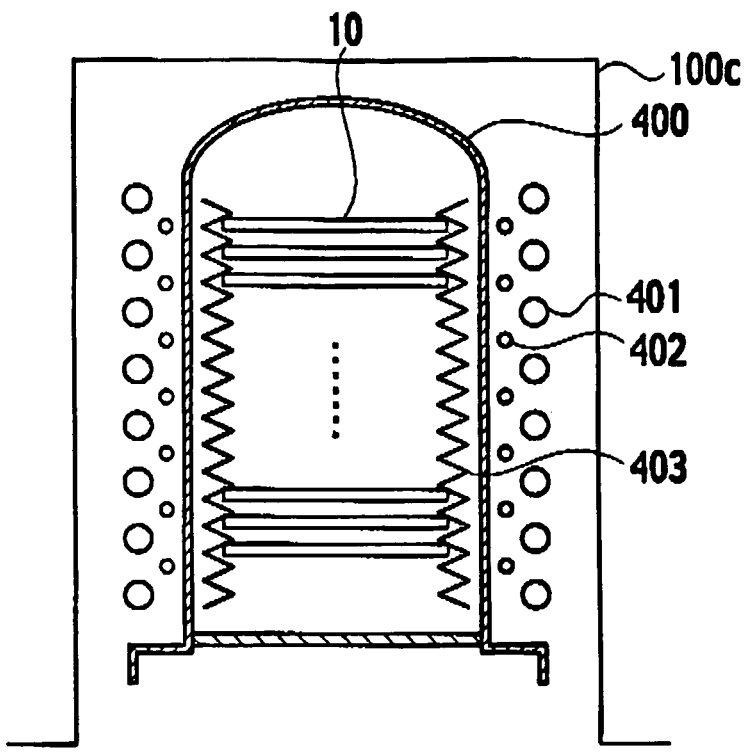
FIG. 40A is a cross-sectional view illustrating the structure of semiconductor manufacturing apparatus according to the sixth embodiment of the present invention.
Figure 40B:
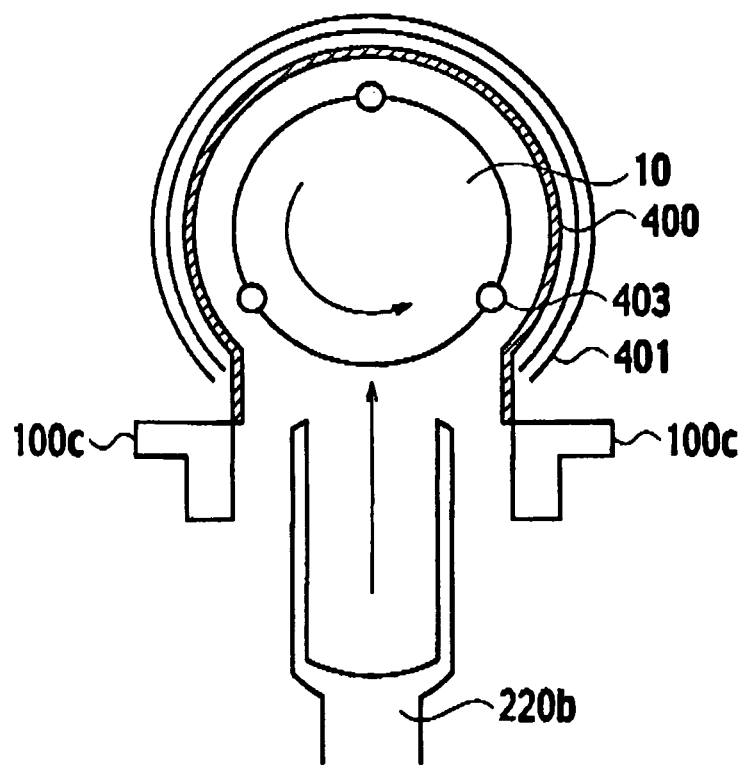
FIG. 40B is a top view of the semiconductor manufacturing apparatus according to the sixth embodiment of the present invention.

In FIGS. 38A and 39, a description has been given of an example of semiconductor manufacturing apparatus including a plurality of hot plates. Hereinafter, a description will be given of an example of semiconductor manufacturing apparatus in which a plurality of substrates are heated by one heating mechanism. Semiconductor manufacturing apparatus illustrated in FIG. 40A includes a chamber 100c, a quartz tube 400 in which a plurality of quartz boards 403 for respectively supporting a plurality of substrates 10 are placed inside, and a heater 401 and a coil 402 for high-frequency application which surround the periphery of the quartz tube 400 to have tubular shapes, respectively. Unlike the case where a plurality of hot plates are used, in the case where the semiconductor manufacturing apparatus illustrated in FIG. 40A is used, a plurality of substrates are simultaneously degassed by use of one heater 401. However, in the case where a plurality of substrates are simultaneously treated, substrates may also be transported one by one as in the case where a plurality of hot plates are used. For example, as illustrated in FIG. 40B, a substrate 10 can be transported using a transport robot hand 220b. However, in the case where a substrate 10 is transported using the transport robot hand 220b, the quartz tube 400 has an opening portion as illustrated in FIG. 40B. Thus, part of the quartz tube 400 is not surrounded by the heater 401. In the case where there is a portion which is not surrounded by the heater 401 as described above, uniformity in the temperature of the quartz tube 400 decreases. Accordingly, a scheme to maintain uniformity in the in-plane temperature of the substrate 10 is necessary: rotating the substrate 10, or the like. Further, uniformity in the in-plane temperature of the substrate 10 can be improved by setting the gas pressure of degassing at several hundreds of pascals or more.

Next, a description will be given of an example of semiconductor manufacturing apparatus in which degassing is efficiently performed by a method other than heating that uses hot plates or a heater. Hereinafter, a description will be given of semiconductor manufacturing apparatus in which water molecules contained in an insulating film are efficiently emitted by use of microwaves. A water molecule has a structure in which two hydrogen atoms bond to one oxygen atom. When the oxygen atom and the hydrogen atoms bond together, electrons in the hydrogen atoms move toward the oxygen atom. In the vicinities of binding sites, the polarity of the oxygen atom is positive and those of the hydrogen atoms are negative. As a result, the water molecule is maintained neutral as a whole while the hydrogen atom sides have positive polarity and the oxygen atom side has negative polarity. Meanwhile, generally, an electromagnetic wave travels in space while alternately changing its polarity to positive or negative (while oscillating). Accordingly, the hitting of a microwave on binding sites between the oxygen atom and the hydrogen atoms means that both positive and negative electric energies are alternately applied to the binding sites. If it is assumed that positive energy is applied to the binding sites of water molecules, the oxygen atoms having negative polarity are pulled toward the microwave and the water molecules simultaneously change their orientations, though the water molecules have been in thermal motion in various directions until then. Then, when negative energy is applied to the binding sites, the hydrogen atoms having positive polarity are pulled at this time. Accordingly, the water molecules simultaneously change their orientations again. By utilizing the above-described characteristics of water molecules and microwaves, it is possible to cause only water molecules to be emitted from an insulating film. In other words, when microwaves emitted from an electromagnetic wave oscillator are applied to an insulating film, water molecules contained in the insulating film are heated by the motion of the water molecules (by dielectric heating). As a result, it is possible to cause only water molecules to be emitted from the insulating film. It should be noted that microwave irradiation is preferably performed under a vacuum condition. Further, in order to prevent the possibility of an arc discharge, microwave irradiation is preferably performed in a state in which a metal film is not exposed. Parameters such as the power of microwaves used are selected depending on an insulating film used.

By-products containing components of gas removed by degassing adsorb to the inside of a chamber for performing degassing. Accordingly, the by-products cause dust or make temperature control during heat treatment difficult. In many cases, gas emitted from the insulating film during degassing is gas containing C, F, and the like emitted in processes using RIE in addition to oxidizing species such as $H_2O$. It takes a long time to maintain the chamber by exposing the chamber to air in order to clear the by-products adsorbed to the inside of the chamber. This causes a decrease in productivity. Accordingly, if the by-products adsorbed to the inside of the chamber are removed using a plasma of gas containing oxygen and hydrogen or radicals, it is possible to complete the cleaning of the chamber in a short time. In other words, it is desirable that the chamber for performing degassing include a cleaning mechanism. For example, a plasma is generated in the quartz tube 400 by providing on the outer periphery of the quartz tube the coil 402 for high-frequency application which applies high-frequency power and by applying high-frequency power while introducing oxygen or hydrogen. As a result, the necessity for maintenance involving exposure to air is eliminated.

For a highly-hygroscopic insulating film, a method is also effective in which an organic solution having a high vapor pressure is substituted for adsorbed water in the insulating film and dried. For example, a substrate is cleaned by dropping methanol, ethanol, or the like onto the substrate and then dried, whereby the number of water molecules contained in an insulating film is reduced. The efficiency of degassing is improved by performing degassing thereafter.

Hereinafter, a description will be given of a method in which EB irradiation and UV light irradiation are performed in order to efficiently improve surface quality. A chamber for performing EB irradiation and UV light irradiation is connected to a transportation room including a substrate transport mechanism. Thus, before or after EB irradiation treatment and UV light irradiation treatment, another treatment can also be performed in another chamber connected to the transportation room under a continuous vacuum condition. For example, after gas adsorbed on an inter-level insulating film is removed or reduced in the chamber for performing EB irradiation and UV light irradiation, the substrate is moved to the inside of another chamber through the transportation room and oxide films on the surfaces of Cu interconnections are removed. A continuous process can be performed in which a barrier metal film is then formed in another chamber and in which a Cu film is further formed in still another chamber.

Figure 41A:
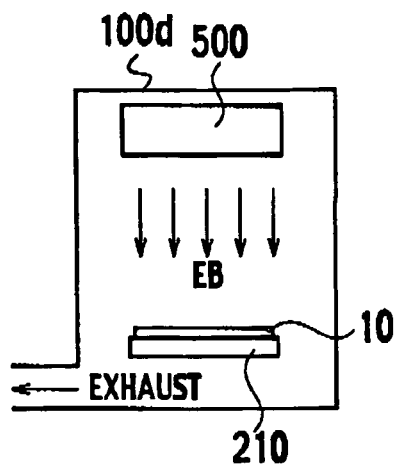
FIG. 41A is a schematic diagram of semiconductor manufacturing apparatus according to the sixth embodiment of the present invention which performs EB irradiation.

FIG. 41A illustrates the structure of semiconductor manufacturing apparatus which has an EB irradiation function and from which a substrate can be transported to a chamber for forming a barrier metal film or a Cu film under a continuous vacuum condition. The semiconductor manufacturing apparatus illustrated in FIG. 41A includes a chamber 100d including a hot plate 210 on which a substrate 10 is placed and including an electron beam source 500 for applying an ED to the substrate 10.

Figure 41B:
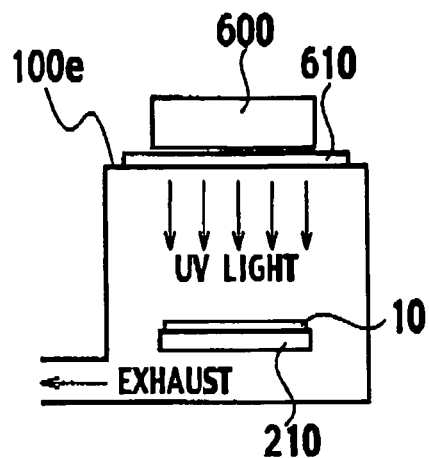
FIG. 41B is a schematic diagram of semiconductor manufacturing apparatus according to the sixth embodiment of the present invention which performs UV light irradiation.

FIG. 41B illustrates an example of semiconductor manufacturing apparatus capable of irradiating UV light. The semiconductor manufacturing apparatus illustrated in FIG. 41B includes a chamber 100d including a hot plate 210 on which a substrate 10 is placed, and includes a UV light source 600 for irradiating UV light to the substrate 10 through a light transmission window 610 provided in the top of the chamber 100d.

As described in the fourth embodiment, terminal groups of atoms on the outermost surface differ depending on the type of an insulating film. There occurs a difference in adsorption characteristics: for example, the surface of the insulating film is hydrophobic in the case where the surface is terminated with $CH_3$ groups, or hydrophilic in the case where the surface is terminated with OH groups. Accordingly, in the case where EB irradiation or UV irradiation is performed on the insulating film before the formation of barrier metal, $CH_3$ groups and the like on the surface of the insulating film can be removed. This facilitates bonding between the insulating film and the barrier metal and improves adhesion. Further, it is possible to ensure polymerization in an incompletely polymerized insulating film and to remove unnecessary gas components from the insulating film.

Figure 42A:
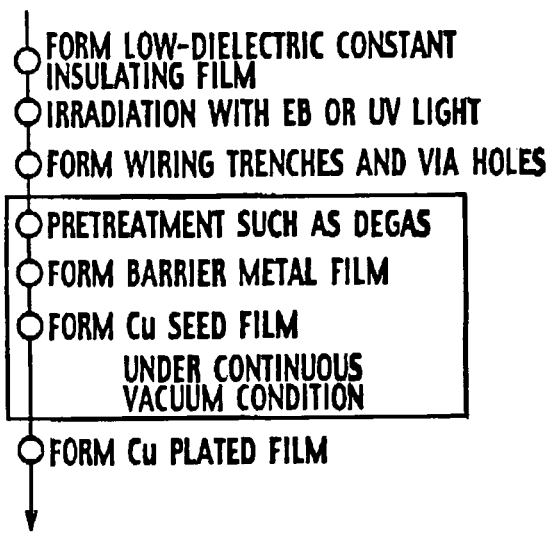
FIGS. 42A and 42B illustrate process flowcharts for explaining the process of curing an insulating film using the semiconductor manufacturing apparatus illustrated in FIG. 42A and the semiconductor manufacturing apparatus illustrated in FIG. 42B.
Figure 42B:
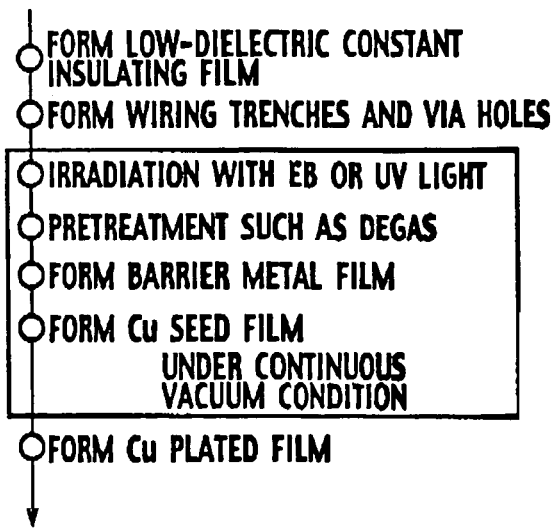

FIGS. 42A and 42B illustrate process flows for cases where surface quality improvement treatments such as EB irradiation or UV light irradiation and degassing are performed. An EB irradiation or UV light irradiation process is a process similar to the process of curing an insulating film. Accordingly, if the EB irradiation or UV light irradiation process is performed a plurality of times, cure proceeds unnecessarily, and the dielectric constant of the insulating film may increase. Accordingly, it is preferable that energy and irradiation time necessary to cure the insulating film are divided and assigned to a process after the formation of the insulating film and a process before the formation of a barrier metal film as illustrated in FIG. 42A. Alternatively, the process flow may be changed so that the process of promoting degassing before the formation of the barrier metal film also serves as the process of curing the insulating film as illustrated in FIG. 42B.

As described above, with the semiconductor manufacturing apparatus according to the sixth embodiment of the present invention, in the case where it takes a long time to perform the process of degassing a highly-hygroscopic low-dielectric constant insulating film, a decrease in throughput can be reduced, and highly efficient degassing can be performed.

Other Embodiments

As described above, the present invention is described using the first to sixth embodiments. However, statements and drawings constituting part of the present disclosure should not be understood to limit the present invention. Various alternate embodiments, embodiments, and operational techniques will become apparent to those skilled in the art from the present disclosure.

For example, in the aforementioned description of the first to sixth embodiments, the cases where Ti and Ti oxide are formed and where Al and Al oxide are formed have been described as examples. However, of course, the following applications are acceptable. For example, a metal film between a wiring layer and an insulating film can be made of tantalum (Ta), tungsten (W), hafnium (Hf), zinc (Zn), magnesium (Mg), zirconium (Zr), or vanadium (V). In particular, it has also been described in the embodiments that, of group IIa, IIIa, IVa, and Va metals, mg, Zr, V, and the like are potential materials.

Moreover, the fourth and fifth embodiments can be applied to the deposition of silicon (Si), Ta, W, Hf, Zn, ruthenium (Ru), or the like, or oxide or nitride thereof if source gas and other gas introduced are changed.

Various modifications will become possible for those skilled in the art after receiving the teachings of the present disclosure without departing from the scope thereof.

What is claimed is:

1. A semiconductor device comprising:
a substrate;
an insulating film having a recessed portion in a surface thereof formed above the substrate;
a metal film formed above the insulating film;
an oxidized metal film of the metal film inserted between the insulating film and the metal film;
a wiring metal film formed above the metal film; and
a compound layer of the metal film and the wiring metal film inserted between the metal film and the wiring metal film,
wherein diffraction intensity of the oxidized metal film by X-ray diffractometry is not more than ten times diffraction intensity of the compound layer,
wherein an oxygen content of the metal film in a portion on a side of the insulating film is higher than the oxygen content of the metal film in a portion on a side of the wiring metal film, and
wherein the oxygen content of the metal film gradually changes in a direction perpendicular to the planar surface of the substrate.

2. The semiconductor device of claim 1, further comprising a lower level wiring film formed between the substrate and the insulating film, the lower level wiring film is in contact with the oxidized metal film at the bottom of the recessed portion,
wherein an oxygen content of the oxidized metal film at the bottom of the recessed portion is lower than the oxygen content of the oxidized metal film in a portion in contact with the insulating film.

3. The semiconductor device of claim 1, wherein an atomic or molecular concentration of the metal film in a portion on a side of the insulating film is higher than the atomic or molecular concentration of the metal film in a portion on a side of the wiring metal film.

4. The semiconductor device of claim 1, wherein the oxidized metal film has a molecular concentration not less than 80% of an atomic concentration of the metal film.

5. The semiconductor device of claim 1, wherein the metal film is a Ti film, and an O/Ti ratio of a portion in contact with the wiring metal film is lower than the O/Ti ratio of the portion in contact with the insulating film.

6. The semiconductor device of claim 5, wherein the O/Ti ratio of the portion in contact with the wiring metal film by electron energy-loss spectroscopy analysis is less than 0.12.

7. The semiconductor device of claim 1, wherein the metal film is a Ti film, and an atomic ratio of oxygen to Ti in the oxidized metal film is 5/3 or less.

8. The semiconductor device of claim 1, wherein the metal film is a mixed film including one of TiRuX, TiPdX, TiPt and TiAuX.

9. A semiconductor device comprising:
a substrate;
an insulating film formed above the substrate and heated at a first substrate temperature so that oxidizing species are emitted therefrom, the insulating film having a recessed portion formed in a surface thereof;
a metal film formed above the insulating film, which has been heated at the first substrate temperature, at a second substrate temperature lower than the first substrate temperature; and
an oxidized metal film of the metal film inserted between the insulating film and the metal film, the oxidized metal film being formed by oxidizing at least a part of the metal film with oxidizing species remaining in the insulating film, and
a wiring metal film formed above the metal film,
wherein an oxygen content of the metal film in a portion on a side of the insulating film is higher than the oxygen content of the metal film in a portion on a side of the wiring metal film, and wherein the oxygen content of the metal film gradually changes in a direction perpendicular to the planar surface of the substrate.

10. The semiconductor device of claim 9, wherein the oxidizing is caused by a heat treatment.

11. The semiconductor device of claim 9, wherein the oxidizing is caused by a diffusion of oxygen into spaces between metal atoms and a solid solution of oxygen in the metal film.

12. The semiconductor device of claim 9, further comprising:
a compound layer of the metal film and the wiring metal film inserted between the metal film and the wiring metal film,
wherein diffraction intensity of the oxidized metal film by X-ray diffractometry is not more than ten times diffraction intensity of the compound layer.

13. The semiconductor device of claim 12, wherein an atomic or molecular concentration of the metal film in a portion on a side of the insulating film is higher than the atomic or molecular concentration of the metal film in a portion on a side of the wiring metal film.

14. The semiconductor device of claim 12, wherein the metal film is a Ti film, and an O/Ti ratio of a portion in contact with the wiring metal film is lower than the O/Ti ratio of the portion in contact with the insulating film.

15. The semiconductor device of claim 14, wherein the O/Ti ratio of the portion in contact with the wiring metal film by electron energy-loss spectroscopy analysis is less than 0.12.

16. The semiconductor device of claim 9, further comprising:
an adherent metal layer formed above the oxidized metal film, a solid solubility of oxygen of the adherent metal layer being lower than the solid solubility of the metal film;
wherein the wiring metal film is formed above the adherent metal film.

17. The semiconductor device of claim 9, further comprising a lower level wiring film formed between the substrate and the insulating film, the lower level wiring film is in contact with the oxidized metal film at the bottom of the recessed portion,
wherein an oxygen content of the oxidized metal film at the bottom of the recessed portion is lower than the oxygen content of the oxidized metal film in a portion in contact with the insulating film.

18. The semiconductor device of claim 9, wherein the oxidized metal film has a molecular concentration not less than 80% of an atomic concentration of the metal film.

19. The semiconductor device of claim 9, wherein the metal film is a Ti film, and an atomic ratio of oxygen to Ti in the oxidized metal film is 5/3 or less.

20. The semiconductor device of claim 9, wherein the metal film is a mixed film including one of TiRuX, TiPdX, TiPt and TiAuX.

* * * * *